United States Patent
Suzuki et al.

(10) Patent No.: US 12,529,888 B2
(45) Date of Patent: Jan. 20, 2026

(54) PIEZOELECTRIC UNIT AND ACTUATOR DEVICE

(71) Applicant: HAMAMATSU PHOTONICS K.K., Hamamatsu (JP)

(72) Inventors: Daiki Suzuki, Hamamatsu (JP); Takuma Osaki, Hamamatsu (JP); Makoto Nozaki, Hamamatsu (JP); Kota Sugizaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 932 days.

(21) Appl. No.: 17/736,146

(22) Filed: May 4, 2022

(65) Prior Publication Data

US 2022/0365337 A1 Nov. 17, 2022

(30) Foreign Application Priority Data

May 12, 2021 (JP) ................................. 2021-080861

(51) Int. Cl.
*G02B 26/08* (2006.01)
*H10N 30/20* (2023.01)

(52) U.S. Cl.
CPC ....... *G02B 26/0858* (2013.01); *H10N 30/204* (2023.02)

(58) Field of Classification Search
CPC ............ G02B 26/0858; H10N 30/204; H10N 30/101; H10N 30/87
See application file for complete search history.

(56) References Cited

U.S. PATENT DOCUMENTS

| | | |
|---|---|---|
| 11,567,100 B2 | 1/2023 | Reinke |
| 11,581,480 B2 | 2/2023 | Akahane |
| 2010/0110527 A1 | 5/2010 | Liu et al. |

(Continued)

FOREIGN PATENT DOCUMENTS

| | | |
|---|---|---|
| CN | 115340059 A | 11/2022 |
| CN | 115417369 A | 12/2022 |

(Continued)

OTHER PUBLICATIONS

Machine translation of Tanaka et al. JP 2020187292, Nov. 19, 2020.
(Continued)

*Primary Examiner* — Thomas Truong
(74) *Attorney, Agent, or Firm* — Faegre Drinker Biddle & Reath LLP

(57) ABSTRACT

A piezoelectric drive element disposed on a placement surface of a metal substrate includes a piezoelectric drive body having a first main surface opposite the placement surface, a second main surface on a placement surface side, and a side surface, and a first electrode disposed on the first main surface. The piezoelectric drive element is disposed on the placement surface such that a part of the placement surface is located outside the side surface. A second bonding member having conductivity includes a first portion disposed between the placement surface and the piezoelectric drive element, and a second portion being continuous from the first portion and disposed in a corner formed by the part of the placement surface and the side surface. The second portion does not reach the first electrode.

9 Claims, 13 Drawing Sheets

(56) References Cited

U.S. PATENT DOCUMENTS

| | | | |
|---|---|---|---|
| 2010/0327703 A1* | 12/2010 | Uetani | H10N 30/877 29/25.35 |
| 2013/0301099 A1 | 11/2013 | Mizoguchi et al. | |
| 2016/0049574 A1 | 2/2016 | Iwazaki et al. | |
| 2017/0199375 A1 | 7/2017 | Naono | |
| 2017/0217764 A1 | 8/2017 | Li et al. | |
| 2018/0040514 A1 | 2/2018 | Goh et al. | |
| 2018/0062065 A1 | 3/2018 | Arakawa et al. | |
| 2018/0088336 A1 | 3/2018 | Hino et al. | |
| 2018/0151796 A1 | 5/2018 | Akahane | |
| 2018/0226563 A1* | 8/2018 | Kijima | H10N 30/88 |
| 2020/0073113 A1 | 3/2020 | Nystrom | |
| 2020/0363631 A1 | 11/2020 | Luizzi et al. | |
| 2021/0140993 A1 | 5/2021 | Reinke | |
| 2021/0343925 A1* | 11/2021 | Saito | H10N 30/302 |
| 2022/0365337 A1 | 11/2022 | Suzuki et al. | |
| 2022/0367783 A1 | 11/2022 | Suzuki et al. | |
| 2022/0367786 A1 | 11/2022 | Suzuki et al. | |

FOREIGN PATENT DOCUMENTS

| | | | |
|---|---|---|---|
| JP | H7-128361 A | | 5/1995 |
| JP | H10-315485 A | | 12/1998 |
| JP | 2010-103987 A | | 5/2010 |
| JP | 2011-150038 A | | 8/2011 |
| JP | 2011-179015 A | | 9/2011 |
| JP | 2012-058367 A | | 3/2012 |
| JP | 2012-078389 A | | 4/2012 |
| JP | 2012-247523 A | | 12/2012 |
| JP | 2013114014 A | * | 6/2013 |
| JP | 2013-164278 A | | 8/2013 |
| JP | 2014-160140 A | | 9/2014 |
| JP | 2015-018047 A | | 1/2015 |
| JP | 2016-081986 A | | 5/2016 |
| JP | 2017-156522 A | | 9/2017 |
| JP | 2019-045770 A | | 3/2019 |
| JP | 2019-125777 A | | 7/2019 |
| JP | 2019-132906 A | | 8/2019 |
| JP | 2020-027893 A | | 2/2020 |
| JP | 2020-187292 A | | 11/2020 |
| JP | 2021-087135 A | | 6/2021 |
| JP | 2022-176027 A | | 11/2022 |
| JP | 2022-176066 A | | 11/2022 |
| JP | 7367494 B2 | | 10/2023 |
| JP | 7672925 B2 | | 5/2025 |
| WO | 2015/064423 A1 | | 5/2015 |
| WO | 2015/198513 A1 | | 12/2015 |

OTHER PUBLICATIONS

Office Action issued May 28, 2025 in related U.S. Appl. No. 17/736,161.

Office Action issued May 30, 2025 in related U.S. Appl. No. 17/736,178.

Notice of Allowance mailed Jun. 3, 2025 in U.S. Appl. No. 17/736,136.

* cited by examiner

PIEZOELECTRIC UNIT AND ACTUATOR DEVICE

TECHNICAL FIELD

The present disclosure relates to a piezoelectric unit and an actuator device.

BACKGROUND

An optical scanner disclosed in Japanese Unexamined Patent Publication No. 2011-150038 includes a substrate having a reflective mirror surface; a piezoelectric element disposed on the substrate; a conductive adhesive disposed between the substrate and a lower electrode of the piezoelectric element; and an insulating underfill material disposed to surround the conductive adhesive. In the optical scanner disclosed in Japanese Unexamined Patent Publication No. 2011-150038, in order to prevent the occurrence of a short circuit in the piezoelectric element due to the conductive adhesive reaching an upper electrode of the piezoelectric element, the insulating underfill material is disposed to reach a side surface of the piezoelectric element from a region between the substrate and the piezoelectric element.

In the optical scanner disclosed in Japanese Unexamined Patent Publication No. 2011-150038, since an interface between the conductive adhesive and the underfill material exists between the substrate and the piezoelectric element, the interface interferes with the propagation of vibration of the piezoelectric element to the metal substrate, and decreases the driving efficiency of the metal substrate, which is a concern. In addition, when the piezoelectric element of the optical scanner disclosed in Japanese Unexamined Patent Publication No. 2011-150038 detects an oscillation angle of a reflective mirror portion, since the interface exists between the conductive adhesive and the underfill material, the accuracy of detection of the oscillation angle of the reflective mirror portion decreases, which is a concern. Further, in the optical scanner disclosed in Japanese Unexamined Patent Publication No. 2011-150038, since not only the conductive adhesive but also the insulating underfill material exist between the substrate and the piezoelectric element, the reliability of electrical connection between the substrate and the piezoelectric element decreases, which is a concern.

SUMMARY

An object of the present disclosure is to provide a piezoelectric unit and an actuator device in which electrical connection between a metal substrate and a piezoelectric element can be ensured and a desired driving characteristic can be obtained while a short circuit in the piezoelectric element is prevented.

A piezoelectric unit according to one aspect of the present disclosure includes: a metal substrate; a piezoelectric element disposed on a placement surface of the metal substrate; and a bonding member having conductivity and bonding the metal substrate and the piezoelectric element. The piezoelectric element includes a piezoelectric body having a first main surface opposite the placement surface, a second main surface on a placement surface side, and a side surface, and a first electrode disposed on the first main surface. The piezoelectric element is disposed on the placement surface such that a part of the placement surface is located outside the side surface. The bonding member includes a first portion disposed between the placement surface and the piezoelectric element, and a second portion being continuous from the first portion and disposed in a corner formed by the part of the placement surface and the side surface of the piezoelectric body. The second portion does not reach the first electrode.

DETAILED DESCRIPTION

Figure 1:
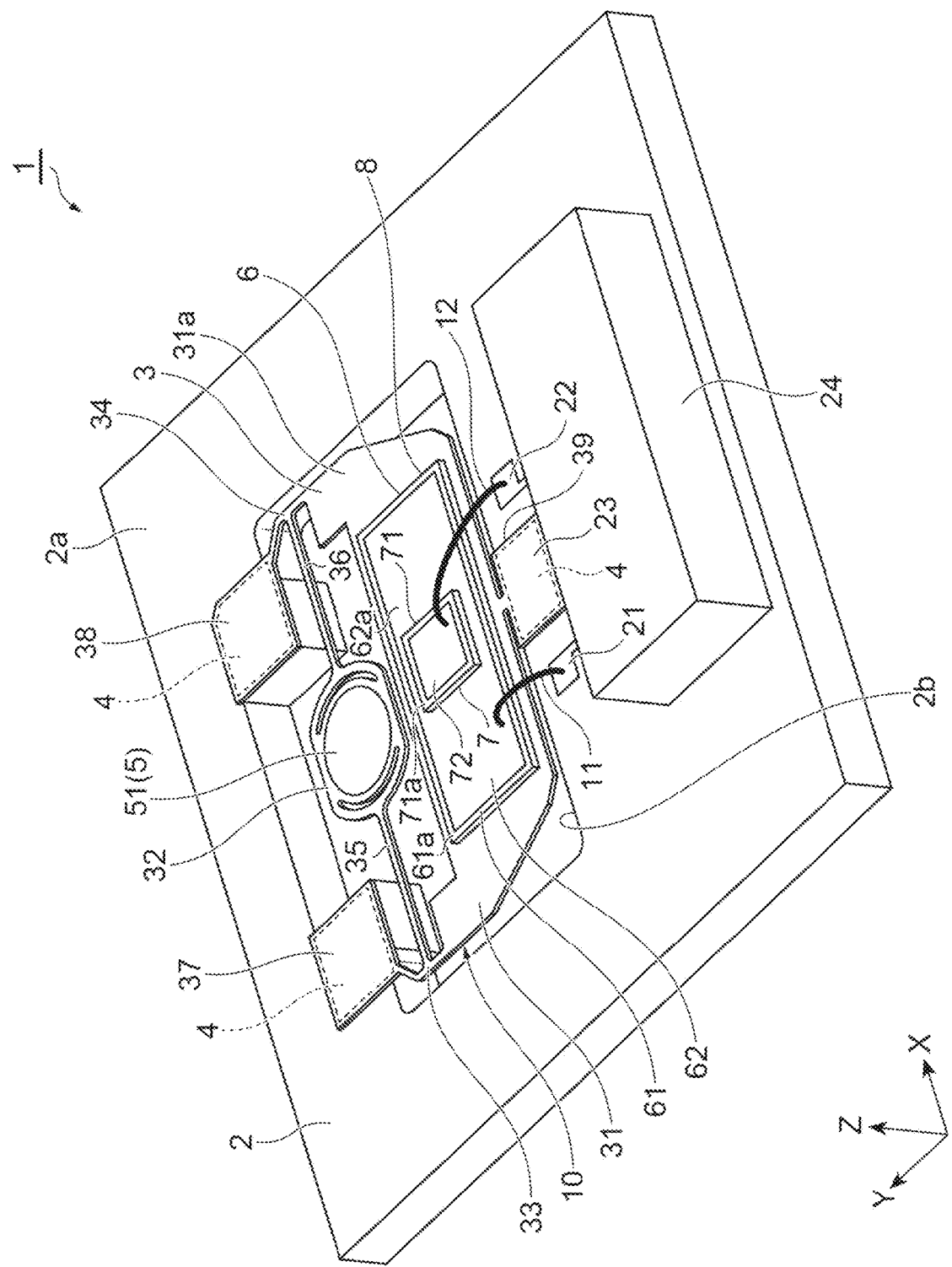
FIG. 1 is a perspective view of an actuator device including a piezoelectric unit of one embodiment.

Hereinafter, an embodiment of the present disclosure will be described in detail with reference to the drawings. Incidentally, in the drawings, the same or equivalent portions are denoted by the same reference signs, and duplicated descriptions will be omitted.

[Configuration of Actuator Device]

Figure 2:
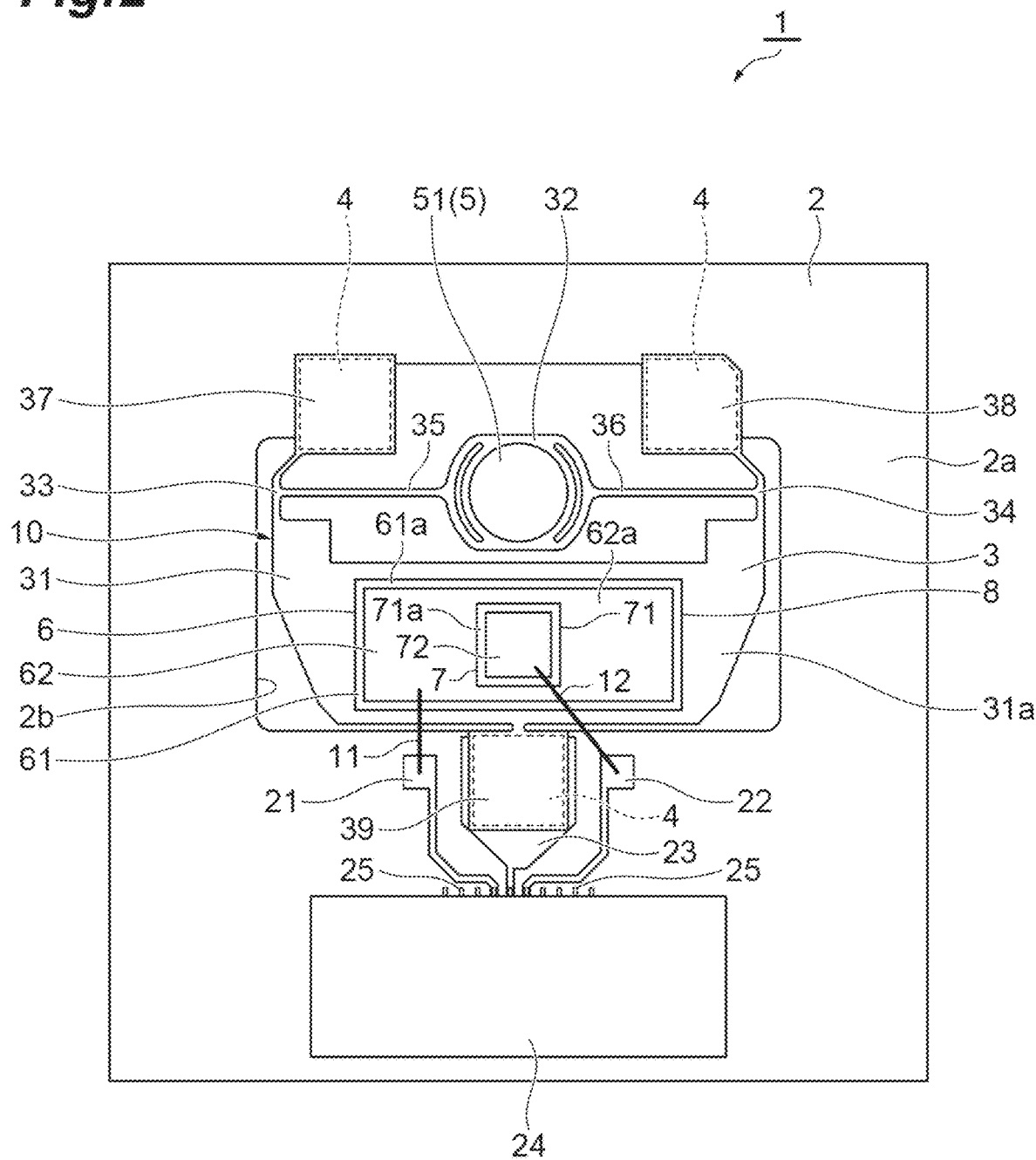
FIG. 2 is a plan view of the actuator device illustrated in FIG. 1.

As illustrated in FIGS. 1 and 2, an actuator device 1 includes a wiring substrate (support body) 2; a metal substrate 3; a first bonding member 4; an optical function unit 5 having an optical surface 51; a piezoelectric drive element (piezoelectric element) 6; a piezoelectric detection element (another piezoelectric element) 7; and a second bonding member (bonding member) 8. The optical function unit 5 is provided on the metal substrate 3. The actuator device 1 is housed, for example, in a package (not illustrated). As one example, the package includes side walls, a bottom wall, and a top wall made of a material that transmits light, and has a box shape. For example, in the actuator device 1, when laser light is incident into the package via the top wall, the laser light is reflected by the optical surface 51 of the optical function unit 5 that is caused to periodically oscillate via the metal substrate 3 by the piezoelectric drive element 6, and is output to the outside via the top wall. An output direction of the laser light from the package changes periodically and continuously according to oscillation of the optical surface 51. Namely, in the present embodiment, the actuator device 1 is an optical scanning device.

The wiring substrate 2 has a placement surface 2a. An opening 2b that is open on the placement surface 2a and on a surface opposite the placement surface 2a is formed in the wiring substrate 2. The wiring substrate 2 has, for example, a rectangular frame shape. Examples of the material of the wiring substrate 2 include silicon, ceramic, quartz, glass, and plastic. The thickness of the wiring substrate 2 may be set to a thickness with which sufficient rigidity can be secured, and is, for example, 0.8 mm or more. In the present embodiment, the thickness of the wiring substrate 2 is 1.6 mm. In the following description, a thickness direction of the wiring substrate 2 is referred to as a Z-axis direction (thickness direction of the metal substrate), one direction perpendicular to the Z-axis direction is referred to as an X-axis direction, and a direction perpendicular to both the Z-axis direction and the X-axis direction is referred to as a Y-axis direction.

A plurality (in the present embodiment, three) of electrode pads 21, 22, and 23 are disposed on the placement surface 2a of the wiring substrate 2. The plurality of electrode pads 21, 22, and 23 are located on one side in the Y-axis direction with respect to the opening 2b of the wiring substrate 2, and are arranged along the X-axis direction. A connector 24 is attached to the placement surface 2a. The connector 24 is a port through which a voltage signal or the like is input to or output from each of the piezoelectric drive element 6 and the piezoelectric detection element 7. The connector 24 is located, for example, on one side in the Y-axis direction with respect to the plurality of electrode pads 21, 22, and 23. The connector 24 includes a plurality of terminals 25. The connector 24 is electrically connected to the plurality of electrode pads 21, 22, and 23 via the plurality of terminals 25, wirings of the wiring substrate 2 and the like.

The metal substrate 3 is supported by the wiring substrate 2. The metal substrate 3 is made of, for example, iron-based, stainless-based, copper-based, permalloy-based, titanium-based, tungsten-based, molybdenum-based metal, or the like, and has a plate shape. The thickness of the metal substrate 3 is, for example, 50 to 500 µm. The first bonding member 4 bonds the wiring substrate 2 and the metal substrate 3. The first bonding member 4 has conductivity. Examples of the material of the first bonding member 4 include an epoxy resin containing Ag particles.

The metal substrate 3 includes a main body portion 31; a movable portion 32; a first extending portion 33; a second extending portion 34; a first coupling portion (coupling portion) 35; a second coupling portion (coupling portion) 36; a first connection portion 37; a second connection portion 38; and a third connection portion 39. The movable portion 32, the first extending portion 33, the second extending portion 34, the first coupling portion 35, the second coupling portion 36, the first connection portion 37, the second connection portion 38, and the third connection portion 39 are integrally formed.

The main body portion 31 is a portion to which the piezoelectric drive element 6 is fixed (disposed). The main body portion 31 is located inside the opening 2b of the wiring substrate 2 when viewed in the Z-axis direction. The movable portion 32 is a portion on which the optical function unit 5 is disposed. The movable portion 32 is located on the other side in the Y-axis direction with respect to the main body portion 31.

The first extending portion 33 and the second extending portion 34 extend from the main body portion 31 such that the movable portion 32 is located between the first extending portion 33 and the second extending portion 34. In the present embodiment, the movable portion 32 is located in the middle between the first extending portion 33 and the second extending portion 34. For example, the first extending portion 33 and the second extending portion 34 extend parallel to each other along the Y-axis direction. In the present embodiment, the first extending portion 33 has the same shape as that of the second extending portion 34.

The first coupling portion 35 extends along the X-axis direction between the first extending portion 33 and the movable portion 32. One end portion of the first coupling portion 35 is connected to the first extending portion 33, and the other end portion of the first coupling portion 35 is connected to the movable portion 32. Namely, the first coupling portion 35 couples the first extending portion 33 and the movable portion 32.

The second coupling portion 36 extends along the X-axis direction between the second extending portion 34 and the movable portion 32. One end portion of the second coupling portion 36 is connected to the second extending portion 34, and the other end portion of the second coupling portion 36 is connected to the movable portion 32. Namely, the second coupling portion 36 couples the second extending portion 34 and the movable portion 32.

In the present embodiment, the first coupling portion 35 and the second coupling portion 36 are located on a single straight line along the X-axis direction. From a positional relationship between the first extending portion 33 and the movable portion 32 and a positional relationship between the second extending portion 34 and the movable portion 32 described above, a length of the first coupling portion 35 in the X-axis direction is the same as a length of the second coupling portion 36 in the X-axis direction. In the present embodiment, the first coupling portion 35 has the same shape as that of the second coupling portion 36.

The movable portion 32, the first extending portion 33, the second extending portion 34, the first coupling portion 35, and the second coupling portion 36 are located inside the opening 2b of the wiring substrate 2 when viewed in the Z-axis direction. The first coupling portion 35 and the second coupling portion 36 function as torsion bars that elastically deform such that torsion bars twist according to deformation (displacement) of the first extending portion 33 and the second extending portion 34. The movable portion 32 oscillates around an axis along the X-axis direction according to elastic deformation of the first coupling portion 35 and the second coupling portion 36. Namely, the movable portion 32 is oscillatably supported by the first extending portion 33 and the second extending portion 34 via the first coupling portion 35 and via the second coupling portion 36.

The optical function unit 5 is disposed on a surface on an opposite side of the movable portion 32 from the opening 2b. The optical function unit 5 has, for example, a disk shape. The optical function unit 5 is attached to the movable portion 32 such that the optical surface 51 faces opposite the movable portion 32. The optical surface 51 is disposed in the middle between the first extending portion 33 and the second extending portion 34 in the X-axis direction. In the present embodiment, each of the metal substrate 3 and the optical surface 51 has a shape that is line symmetric with respect to a straight line passing through the center of the optical surface 51 along the Y-axis direction. As one example, the optical function unit 5 is made of glass or a semiconductor material such as silicon, and the optical surface 51 is formed of a reflective film formed on a surface on an opposite side of the optical function unit 5 from the movable portion 32. Namely, the optical surface 51 is a mirror surface (reflective surface). Incidentally, the reflective film of the optical function unit 5 can be omitted. In that case, the surface itself of the optical function unit 5 on the opposite side may be used as the optical surface 51.

The first connection portion 37 is connected to the first extending portion 33. The first connection portion 37 is located on the other side in the Y-axis direction with respect to the first extending portion 33. A portion on the other side of the first connection portion 37 in the Y-axis direction faces a portion of the wiring substrate 2. The first bonding member 4 is disposed between the portion on the other side of the first connection portion 37 and the portion of the wiring substrate 2. Incidentally, an electrode pad (not illustrated) electrically connected to the electrode pad 23 to have the same potential as that of the electrode pad 23 may be disposed on the portion of the wiring substrate 2.

The second connection portion 38 is connected to the second extending portion 34. The second connection portion 38 is located on the other side in the Y-axis direction with respect to the second extending portion 34. A portion on the other side of the second connection portion 38 in the Y-axis direction faces a portion of the wiring substrate 2. The first bonding member 4 is disposed between the portion on the other side of the second connection portion 38 and the portion of the wiring substrate 2. Incidentally, an electrode pad (not illustrated) electrically connected to the electrode pad 23 to have the same potential as that of the electrode pad 23 may be disposed on the portion of the wiring substrate 2. In the present embodiment, the first connection portion 37 and the second connection portion 38 are in a line symmetric relationship with respect to the straight line passing through the center of the optical surface 51 along the Y-axis direction.

The third connection portion 39 is connected to the main body portion 31. The third connection portion 39 is located on one side in the Y-axis direction with respect to the main body portion 31. A portion on one side of the third connection portion 39 in the Y-axis direction faces a portion of the wiring substrate 2 (portion on which the electrode pad 23 is disposed). The first bonding member 4 is disposed between the portion on the one side of the third connection portion 39 and the portion of the wiring substrate 2.

The piezoelectric drive element 6 is an element that generates plate waves in the metal substrate 3 to drive the actuator device 1. The piezoelectric drive element 6 is disposed on a placement surface 31*a* on an opposite side of the main body portion 31 from the opening 2*b*. The center of the piezoelectric drive element 6 in the X-axis direction is identical to the center of the movable portion 32 in the X-axis direction (namely, the center of the optical surface 51 in the X-axis direction). The piezoelectric drive element 6 includes a piezoelectric drive body (piezoelectric body) 61, a first electrode 62, and a second electrode 63 (refer to FIG. 4).

Figure 4:
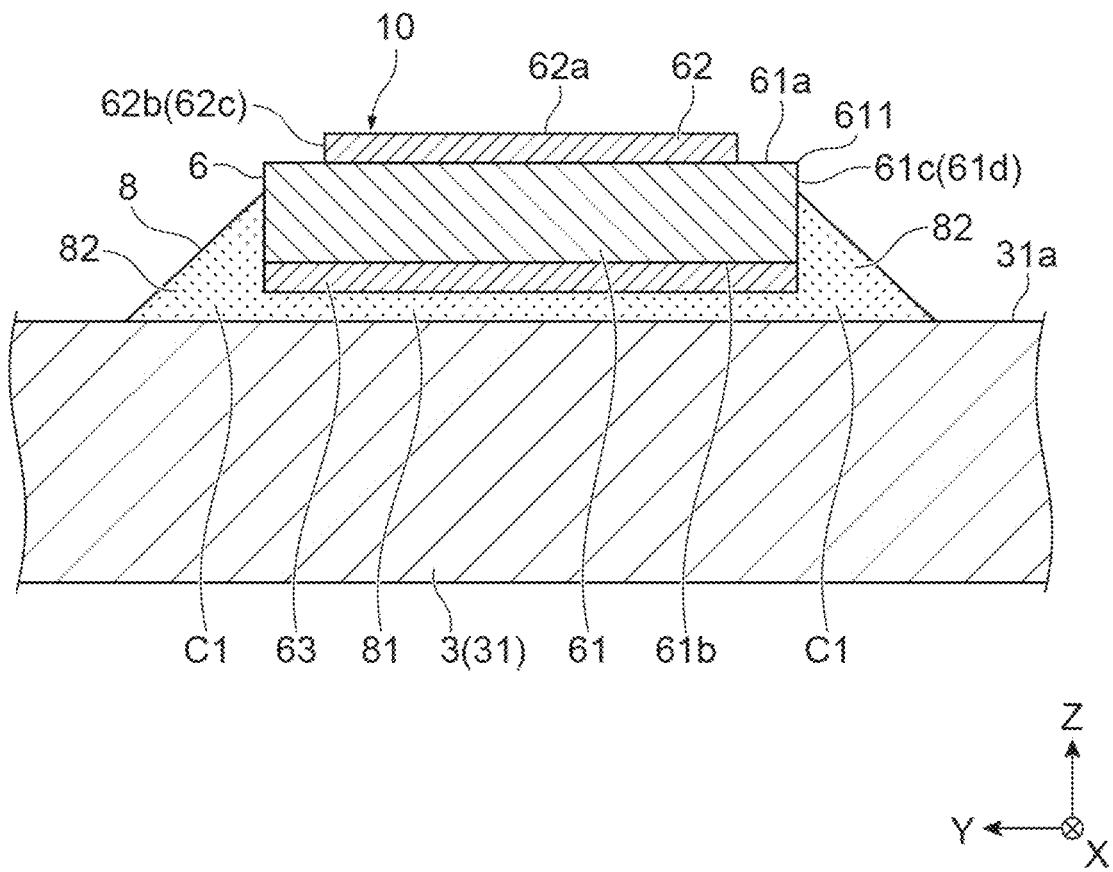
FIG. 4 is a cross-sectional view taken along line IV-IV illustrated in FIG. 3.

The piezoelectric drive body 61 includes a first main surface 61*a* and a second main surface 61*b* (refer to FIG. 4). The first main surface 61*a* is a main surface on an opposite side of the piezoelectric drive body 61 from the placement surface 31*a*. The first electrode 62 is disposed on the first main surface 61*a*. The second main surface 61*b* is a main surface on a placement surface 31*a* side of the piezoelectric drive body 61. The second electrode 63 is disposed on the second main surface 61*b*. Each of the first electrode 62 and the second electrode 63 is, for example, a Ni/Au layer. In the Ni/Au layer, a Ni layer is disposed on the first main surface 61*a*, and a Au layer is disposed on the Ni layer. A thickness of the Ni layer is larger than a thickness of the Au layer. Each of the piezoelectric drive body 61, the first electrode 62, and the second electrode 63 has, for example, a rectangular plate shape. The piezoelectric drive body 61 is electrically connected to the first electrode 62 by being joined to the first electrode 62. The piezoelectric drive body 61 is electrically connected to the second electrode 63 by being joined to the second electrode 63. The second bonding member 8 is disposed between the second electrode 63 and the main body portion 31. The second bonding member 8 bonds the piezoelectric drive body 61 and the metal substrate 3. The second bonding member 8 has conductivity. Examples of the material of the second bonding member 8 include an epoxy resin containing Ag particles.

Figure 5:
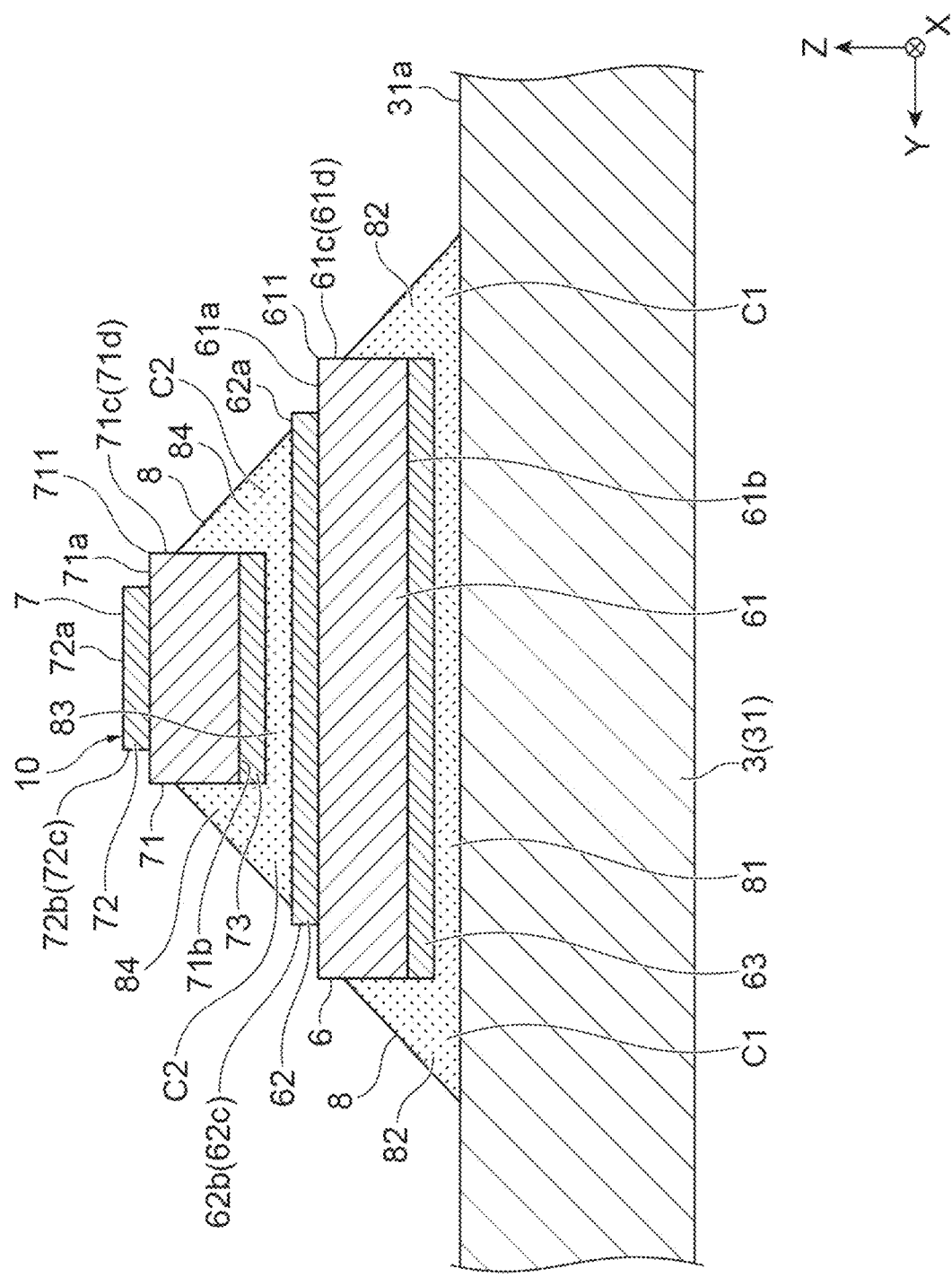
FIG. 5 is a cross-sectional view taken along line V-V illustrated in FIG. 3.

The piezoelectric detection element 7 is an element that detects an oscillation angle of the optical surface 51. The piezoelectric detection element 7 is disposed on a surface 62*a*. The surface 62*a* is a main surface on an opposite side of the first electrode 62 from the piezoelectric drive body 61. The center of the piezoelectric detection element 7 in the X-axis direction is identical to the center of the piezoelectric drive element 6 in the X-axis direction. The piezoelectric detection element 7 includes a piezoelectric detection body (another piezoelectric body) 71, a third electrode 72, and a fourth electrode 73 (refer to FIG. 5). The piezoelectric detection body 71 includes a third main surface 71*a* and a fourth main surface 71*b* (refer to FIG. 5). The third main surface 71*a* is a main surface on an opposite side of the piezoelectric detection body 71 from the first electrode 62. The third electrode 72 is disposed on the third main surface 71*a*. The fourth main surface 71*b* is a main surface on a first electrode 62 side of the piezoelectric detection body 71. The fourth electrode 73 is disposed on the fourth main surface 71*b*. Each of the third electrode 72 and the fourth electrode 73 is, for example, a Ni/Au layer. Each of the piezoelectric detection body 71, the third electrode 72, and the fourth electrode 73 has, for example, a rectangular plate shape. The piezoelectric detection body 71 is electrically connected to the third electrode 72 by being joined to the third electrode 72. The piezoelectric detection body 71 is electrically connected to the fourth electrode 73 by being joined to the fourth electrode 73. The second bonding member 8 is disposed between the fourth electrode 73 and the first electrode 62. The second bonding member 8 bonds the piezoelectric detection body 71 and the piezoelectric drive body 61.

Here, an electrical connection relationship between the wiring substrate 2, the metal substrate 3, the piezoelectric drive element 6, and the piezoelectric detection element 7 will be described. As illustrated in FIG. 2, the first electrode 62 of the piezoelectric drive element 6 is electrically connected to the electrode pad 21 via a wire 11. The electrode pad 21 is electrically connected to a terminal 25 of the connector 24 via a wiring of the wiring substrate 2. Namely, the first electrode 62 of the piezoelectric drive element 6 is electrically connected to the connector 24 via the wire 11, the electrode pad 21, and the wiring of the wiring substrate 2.

The second electrode 63 of the piezoelectric drive element 6 is electrically connected to the metal substrate 3 via the second bonding member 8 disposed between the second electrode 63 and the main body portion 31. The third connection portion 39 of the metal substrate 3 is electrically connected to the electrode pad 23 via the first bonding member 4 disposed between the third connection portion 39 and the electrode pad 23. The electrode pad 23 is electrically connected to a terminal 25 of the connector 24 via a wiring of the wiring substrate 2. Namely, the second electrode 63 of the piezoelectric drive element 6 is electrically connected to the connector 24 via the second bonding member 8, the metal substrate 3, the first bonding member 4, the electrode pad 23, and the wiring of the wiring substrate 2.

The third electrode 72 of the piezoelectric detection body 71 is electrically connected to the electrode pad 22 via a wire 12. The electrode pad 22 is electrically connected to a terminal 25 of the connector 24 via a wiring of the wiring substrate 2. Namely, the third electrode 72 of the piezoelectric detection body 71 is electrically connected to the connector 24 via the wire 12, the electrode pad 22, and the wiring of the wiring substrate 2.

The fourth electrode 73 of the piezoelectric detection element 7 is electrically connected to the first electrode 62 of the piezoelectric drive element 6 via the second bonding member 8 disposed between the fourth electrode 73 and the first electrode 62 of the piezoelectric drive element 6. Namely, the fourth electrode 73 of the piezoelectric detection element 7 is electrically connected to the connector 24 via the second bonding member 8, the first electrode 62 of the piezoelectric drive element 6, the wire 11, the electrode pad 21, and the wiring of the wiring substrate 2.

The actuator device 1 is driven, for example, as follows according to the above-described electrical connection relationship. Specifically, in a state where the first electrode 62 of the piezoelectric drive element 6 and the fourth electrode 73 of the piezoelectric detection element 7 are connected to a reference potential (for example, a ground potential) via the wire 11, the electrode pad 21, the wiring of the wiring substrate 2, and the connector 24, a drive voltage signal is input to the second electrode 63 of the piezoelectric drive element 6 from the outside of the actuator device 1 via the connector 24, the wiring of the wiring substrate 2, the electrode pad 23, the first bonding member 4, and the metal substrate 3. Accordingly, the piezoelectric drive element 6 deforms and/or vibrates to generate periodic plate waves in the main body portion 31. Because of the generation of the periodic plate waves, torsional vibration (torsional resonance) is induced in the first coupling portion 35 and in the second coupling portion 36, and the movable portion 32 and the optical surface 51 oscillate. Namely, in the actuator device 1, while a torsional resonance system formed of the first coupling portion 35, the second coupling portion 36, the movable portion 32, and the optical surface 51 and the piezoelectric drive element 6 are disposed at separate positions, a Lamb wave resonance system is adopted, so that torsional resonance is generated with high driving efficiency. On the other hand, a voltage signal corresponding to a change in angle caused by the oscillation of the movable portion 32 and the optical surface 51 is output from the third electrode 72 of the piezoelectric detection body 71 to the outside of the actuator device 1 via the wire 12, the electrode pad 22, the wiring of the wiring substrate 2, and the connector 24, and an oscillation angle of the optical surface 51 is detected.

[Configuration of Second Bonding Member Included in Piezoelectric Unit]

Figure 3:
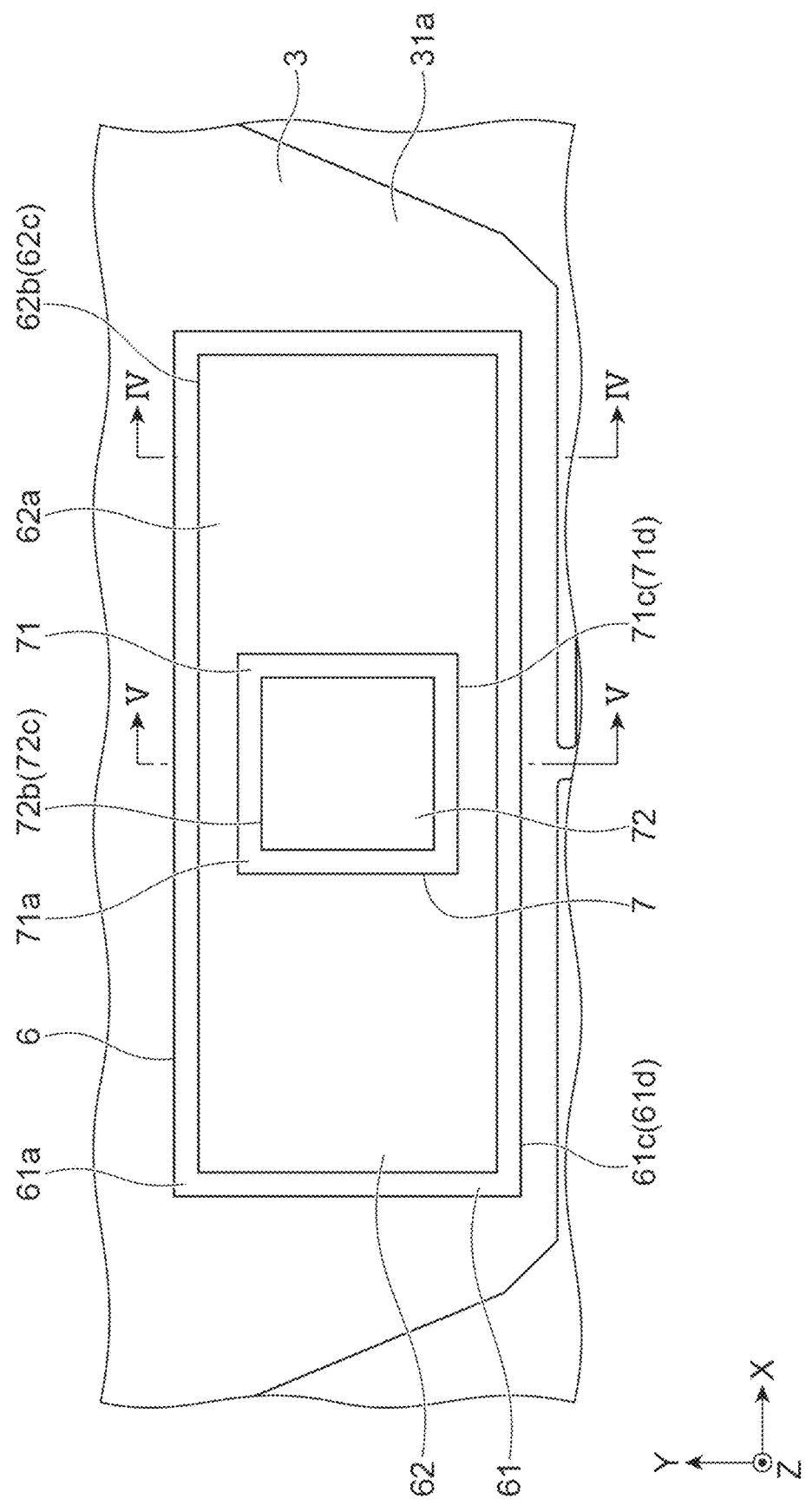
FIG. 3 is a plan view of a portion of a metal substrate, a piezoelectric drive element, and a piezoelectric detection element illustrated in FIG. 2.

Here, the actuator device 1 includes a piezoelectric unit 10. The piezoelectric unit 10 includes the metal substrate 3, the piezoelectric drive element 6, the piezoelectric detection element 7, and the second bonding member 8 described above. Hereinafter, a configuration of the second bonding member 8 included in the piezoelectric unit 10 will be described in more detail with reference to FIGS. 3, 4, and 5.

The piezoelectric drive body 61 of the piezoelectric drive element 6 further includes a side surface 61c. The piezoelectric drive element 6 is disposed on the placement surface 31a such that a part of the placement surface 31a is located outside the side surface 61c of the piezoelectric drive body 61. Accordingly, a corner C1 is formed by the part of the placement surface 31a and the side surface 61c of the piezoelectric drive body 61. The part of the placement surface 31a is a portion of the placement surface 31a outside the side surface 61c. Incidentally, the side surface 61c corresponds to an outer edge 61d of the piezoelectric drive body 61 when viewed in the Z-axis direction.

The second bonding member 8 includes a first portion 81 and a second portion 82. The first portion 81 is a portion disposed between the placement surface 31a and the piezoelectric drive element 6. The second portion 82 is continuous from the first portion 81 and is disposed in the corner C1. "The second portion 82 is continuous from the first portion 81" means that the first portion 81 and the second portion 82 are integrally formed without an interface therebetween. The second portion 82 is in contact with the side surface 61c of the piezoelectric drive body 61 and with the part of the placement surface 31a. In the present embodiment, a surface of the second portion 82 is flat. As one example, the second portion 82 is continuous over the entirety of the corner C1 when viewed in the Z-axis direction.

At least a part of the second portion 82 reaches a region on the first electrode 62 side of the side surface 61c of the piezoelectric drive body 61. "At least a part of the second portion 82 reaches a region on the first electrode 62 side of the side surface 61c of the piezoelectric drive body 61" means that the second portion 82 is in contact with half a region on the first electrode 62 side of the side surface 61c in the Z-axis direction. In addition, the second portion 82 does not reach an outer edge 611 of the first main surface 61a. Namely, a highest edge portion of the second portion 82 is not in contact with the outer edge 611. Namely, the second bonding member 8 disposed on the placement surface 31a of the metal substrate 3 does not reach the first electrode 62.

As one example, the height of the first portion 81 in the Z-axis direction is 10 to 100 μm. A height of the second portion 82 in the Z-axis direction is larger than the sum of the height of the first portion 81 and a thickness of the second electrode 63 in the Z-axis direction, and is equal to or less than the sum of the height of the first portion 81, the thickness of the second electrode 63, and a thickness of the piezoelectric drive body 61 in the Z-axis direction. As one example, the height of the second portion 82 is 15 μm to 300 μm. As one example, the width of the second portion 82 in the X-axis direction and in the Y-axis direction is 100 to 500 μm. "The width of the second portion 82 in the X-axis direction and in the Y-axis direction" includes a width by which the second portion 82 protrudes from the side surface 61c of the piezoelectric drive body 61, in a cross section of the piezoelectric drive element 6 and the second bonding member 8 taken along the Y-axis direction, and a width by which the second portion 82 protrudes from the side surface 61c of the piezoelectric drive body 61, in a cross section of the piezoelectric drive element 6 and the second bonding member 8 taken along the X-axis direction. As one example, the piezoelectric drive body 61 has a rectangular plate shape. Each of the width of the piezoelectric drive body 61 in the X-axis direction and the width of the piezoelectric drive body 61 in the Y-axis direction is, for example, 2 to 20 mm, and the thickness of the piezoelectric drive body 61 is approximately 200 μm. As one example, the piezoelectric drive body 61 has an oblong plate shape having the X-axis direction as a longitudinal direction. As one example, each of the thickness of the first electrode 62 and the thickness of the second electrode 63 is 1 to 2 μm. In addition, as one example, the second bonding member 8 has a Young's modulus of 1 MPa or more.

A width of the first electrode 62 in the X-axis direction is smaller than the width of the piezoelectric drive body 61 in the X-axis direction, and a width of the first electrode 62 in the Y-axis direction is smaller than the width of the piezoelectric drive body 61 in the Y-axis direction. In addition, when viewed in the Z-axis direction, an outer edge 62c of the first electrode 62 is located inside the outer edge 61d of the piezoelectric drive body 61. "When viewed in the Z-axis direction, the outer edge 62c of the first electrode 62 is located inside the outer edge 61d of the piezoelectric drive body 61" means that the outer edge 61d of the piezoelectric drive body 61 surrounds the outer edge 62c of the first electrode 62 when viewed in the Z-axis direction. Namely, when viewed in the Z-axis direction, the outer edge 62c is offset from the outer edge 61d to a center side of the piezoelectric drive body 61. As one example, a distance between the outer edge 62c and the outer edge 61d when viewed in the Z-axis direction is larger than the thickness of the piezoelectric drive body 61. The distance between the outer edge 62c and the outer edge 61d is, for example, approximately 250 μm. In the present embodiment, the distance between the outer edge 62c and the outer edge 61d when viewed in the Z-axis direction is larger than a distance between the highest edge portion of the second portion 82 and the outer edge 611 of the first main surface 61a when seen in the X-axis direction. According to this configuration, it is possible to reliably prevent the second bonding member 8 having conductivity from coming into contact with the first electrode 62. The distance between the highest edge portion of the second portion 82 and the outer edge 611 when seen in the X-axis direction is, for example, approximately 50 μm.

The piezoelectric detection body 71 of the piezoelectric detection element 7 further includes a side surface (another side surface) 71c. The piezoelectric detection element 7 is disposed on the surface 62a such that a part of the surface 62a of the first electrode 62 is located outside the side surface 71c of the piezoelectric detection body 71. Accordingly, a corner (another corner) C2 is formed by the part of the surface 62a of the first electrode 62 and the side surface 71c of the piezoelectric detection body 71. The part of the surface 62a is a portion of the surface 62a outside the side surface 71c. Incidentally, the side surface 71c corresponds to an outer edge 71d of the piezoelectric detection body 71 when viewed in the Z-axis direction.

The second bonding member 8 further includes a third portion 83 and a fourth portion 84. The third portion 83 is a portion disposed between the surface 62a of the first electrode 62 and the piezoelectric detection element 7. The fourth portion 84 is continuous from the third portion 83 and is disposed in the corner C2. "The fourth portion 84 is continuous from the third portion 83" means that the third portion 83 and the fourth portion 84 are integrally formed without an interface therebetween. The fourth portion 84 is in contact with the side surface 71c of the piezoelectric detection body 71 and with the part of the surface 62a of the first electrode 62. In the present embodiment, a surface of the fourth portion 84 is flat. As one example, the fourth portion 84 is continuous over the entirety of the corner C2 when viewed in the Z-axis direction.

At least a part of the fourth portion 84 reaches a region on a third electrode 72 side of the side surface 71c of the piezoelectric detection body 71. "At least a part of the fourth portion 84 reaches a region on a third electrode 72 side of the side surface 71c of the piezoelectric detection body 71" means that the fourth portion 84 is in contact with half a region on the third electrode 72 side of the side surface 71c in the Z-axis direction. In addition, the fourth portion 84 does not reach an outer edge 711 of the third main surface 71a. Namely, a highest edge portion of the fourth portion 84 is not in contact with the outer edge 711. Namely, the second bonding member 8 disposed on the surface 62a of the first electrode 62 does not reach the third electrode 72.

As one example, the height of the third portion 83 in the Z-axis direction is 10 to 100 μm. A height of the fourth portion 84 in the Z-axis direction is larger than the sum of the height of the third portion 83 and a thickness of the fourth electrode 73 in the Z-axis direction, and is equal to or less than the sum of the height of the third portion 83, the thickness of the fourth electrode 73, and a thickness of the piezoelectric detection body 71 in the Z-axis direction. As one example, the height of the fourth portion 84 is 15 μm to 300 μm. As one example, the width of the fourth portion 84 in the X-axis direction and in the Y-axis direction is 100 to 500 μm. "The width of the fourth portion 84 in the X-axis direction and in the Y-axis direction" includes a width by which the fourth portion 84 protrudes from the side surface 71c of the piezoelectric detection body 71, in a cross section of the piezoelectric detection element 7 and the second bonding member 8 taken along the Y-axis direction, and a width by which the fourth portion 84 protrudes from the side surface 71c of the piezoelectric detection body 71, in a cross section of the piezoelectric detection element 7 and the second bonding member 8 taken along the X-axis direction. As one example, the piezoelectric detection body 71 has a rectangular plate shape. Each of the width of the piezoelectric detection body 71 in the X-axis direction and the width of the piezoelectric detection body 71 in the Y-axis direction is, for example, 2 to 20 mm, and the thickness of the piezoelectric detection body 71 is approximately 200 μm. As one example, the piezoelectric detection body 71 has a square plate shape in which a width in the X-axis direction and a width in the Y-axis direction are substantially the same. As one example, each of the thickness of the third electrode 72 and the thickness of the fourth electrode 73 is 1 to 2 μm.

A width of the third electrode 72 in the X-axis direction is smaller than the width of the piezoelectric detection body 71 in the X-axis direction, and a width of the third electrode 72 in the Y-axis direction is smaller than the width of the piezoelectric detection body 71 in the Y-axis direction. In addition, when viewed in the Z-axis direction, an outer edge 72c of the third electrode 72 (outer edge corresponding to a side surface 72b of the third electrode 72) is located inside the outer edge 71d of the piezoelectric detection body 71. "When viewed in the Z-axis direction, the outer edge 72c of the third electrode 72 is located inside the outer edge 71d of the piezoelectric detection body 71" means that the outer edge 71d of the piezoelectric detection body 71 surrounds the outer edge 72c of the third electrode 72 when viewed in the Z-axis direction. Namely, when viewed in the Z-axis direction, the outer edge 72c is offset from the outer edge 71d to a center side of the piezoelectric detection body 71. As one example, a distance between the outer edge 72c and the outer edge 71d when viewed in the Z-axis direction is larger than the thickness of the piezoelectric detection body 71. The distance between the outer edge 72c and the outer edge 71d is, for example, approximately 250 μm similarly to the distance between the outer edge 62c and the outer edge 61d. Incidentally, for example, in a case where the third electrode 72 has a square plate shape when viewed in the Z-axis direction, the distance between the outer edge 72c and the outer edge 71d may smaller than the distance between the outer edge 62c and the outer edge 61d when viewed in the Z-axis direction. The reason is that the amount and the range of protrusion of the second bonding member 8 from the piezoelectric detection body 71 (and the fourth electrode 73) having a square plate shape are more easily controlled when compared to a case where the piezoelectric detection body 71 has an oblong plate shape. In addition, when the piezoelectric detection body 71 has a square plate shape, since the amount and the range of protrusion of the second bonding member 8 from the piezoelectric detection body 71 are easily controlled, the second bonding member 8 is easily disposed over the entirety of the corner C2. In the present embodiment, the distance between the outer edge 72c and the outer edge 71d when viewed in the Z-axis direction is longer than a distance between the highest edge portion of the fourth portion 84 and the outer edge 711 of the third main surface 71a when viewed in the X-axis direction. According to this configuration, it is possible to reliably prevent the second bonding member 8 having conductivity from coming into contact with the third electrode 72. The distance between the highest edge portion of the fourth portion 84 and the outer edge 711 when viewed in the X-axis direction is, for example, approximately 50 µm.

[Actions and Effects]

In the piezoelectric unit 10, the second bonding member 8 includes the first portion 81 disposed between the placement surface 31a of the metal substrate 3 and the piezoelectric drive element 6, and the second portion 82 disposed in the corner C1 formed by the part of the placement surface 31a and the side surface 61c of the piezoelectric drive body 61, and the second portion 82 is continuous from the first portion 81. Accordingly, the vibration of the piezoelectric drive body 61 appropriately propagates to the metal substrate 3. Therefore, it is possible to improve the driving characteristic of the metal substrate 3, and it is possible to ensure electrical connection between the metal substrate 3 and the piezoelectric drive element 6. Further, since the second portion 82 of the second bonding member 8 does not reach the first electrode 62, it is possible to prevent a short circuit in the piezoelectric drive element 6. Therefore, according to the piezoelectric unit 10 and the actuator device 1 including the piezoelectric unit 10, while preventing a short circuit in the piezoelectric drive element 6, it is possible to ensure electrical connection between the metal substrate 3 and the piezoelectric drive element 6, and it is possible to obtain a desired driving characteristic.

Further, in the piezoelectric unit 10, since the second bonding member 8 is continuously disposed to reach the side surface 61c of the piezoelectric drive body 61 from a region between the placement surface 31a of the metal substrate 3 and the piezoelectric drive element 6, it is possible to secure bonding strength between the metal substrate 3 and the piezoelectric drive element 6.

In the piezoelectric unit 10, when viewed in the Z-axis direction, the outer edge 62c of the first electrode 62 is located inside the outer edge 61d of the piezoelectric drive body 61. Accordingly, since it is possible to realize a configuration where the second bonding member 8 does not reach the first electrode 62 even though the second bonding member 8 has reached the outer edge 611 of the first main surface 61a, it is possible to prevent a short circuit in the piezoelectric drive element 6.

For example, when a piezoelectric drive element including a piezoelectric drive body that is relatively thin is used for a piezoelectric unit, a bonding member may reach a first electrode from a side surface of the piezoelectric drive body, and the first electrode and a second electrode are short circuited, which is a concern. Therefore, in the piezoelectric unit of the related art, in order to avoid the risk of occurrence of a short circuit in the piezoelectric drive element, a configuration has been avoided which causes the contact of the bonding member having conductivity with the side surface of the piezoelectric drive body. In contrast, in the piezoelectric unit 10, since the outer edge 62c of the first electrode 62 is offset from the outer edge 61d of the piezoelectric drive body 61 to the center side of the piezoelectric drive element 6, even when the piezoelectric drive body 61 is used which is relatively thin, for example, has a thickness of approximately 200 µm, it is possible to prevent the second bonding member 8 from reaching the first electrode 62. As a result, it is possible to prevent a short circuit between the first electrode 62 and the second electrode 63 while securing bonding strength between the metal substrate 3 and the piezoelectric drive element 6.

The distance between the outer edge 62c of the first electrode 62 and the outer edge 61d of the piezoelectric drive body 61 when viewed in the Z-axis direction is larger than the thickness of the piezoelectric drive body 61. Accordingly, since it is possible to secure the distance between the outer edge 611 of the first main surface 61a and the first electrode 62, it is possible to reliably realize a configuration where the second bonding member 8 does not reach the first electrode 62, and as a result, it is possible to even further prevent a short circuit in the piezoelectric drive element 6.

At least a part of the second portion 82 reaches a region on the first electrode 62 side of the side surface 61c of the piezoelectric drive body 61. Accordingly, it is possible to improve bonding strength between the metal substrate 3 and the piezoelectric drive element 6.

The second portion 82 does not reach the outer edge 611 of the first main surface 61a. Accordingly, while improving bonding strength between the metal substrate 3 and the piezoelectric drive element 6, it is possible to reliably realize a configuration where the second bonding member 8 does not reach the first electrode 62.

The piezoelectric drive element 6 further includes the second electrode 63 disposed on the second main surface 61b. Accordingly, since the wettability of the second bonding member 8 is improved, it is possible to even further ensure electrical connection between the metal substrate 3 and the piezoelectric drive element 6. In addition, even when a crack occurs in the first portion 81 between the metal substrate 3 and the second electrode 63, since it is possible to maintain the energization of the entirety of the second electrode 63, it is possible to prevent a disturbance in an electric field distribution of the piezoelectric drive element 6.

The second bonding member 8 bonds the piezoelectric drive element 6 and the piezoelectric detection element 7. The piezoelectric detection element 7 is disposed on the surface 62a of the first electrode 62, has the third main surface 71a opposite the surface 62a, the fourth main surface 71b on a surface 62a side, and the side surface 71c, and includes the piezoelectric detection body 71 and the third electrode 72 disposed on the third main surface 71a. The piezoelectric detection element 7 is disposed on the surface 62a such that a part of the surface 62a is located outside the side surface 71c of the piezoelectric detection body 71. The second bonding member 8 includes the third portion 83 disposed between the surface 62a and the piezoelectric detection element 7, and the fourth portion 84 being continuous from the third portion 83 and disposed in the corner C2 formed by the part of the surface 62a and the side surface 71c of the piezoelectric detection body 71, and the fourth portion 84 does not reach the third electrode 72. Accordingly, when the piezoelectric drive element 6 and the piezoelectric detection element 7 are stacked on top of each other, it is possible to secure bonding strength between the piezoelectric drive element 6 and the piezoelectric detection element 7.

Modification Examples

Figure 6:
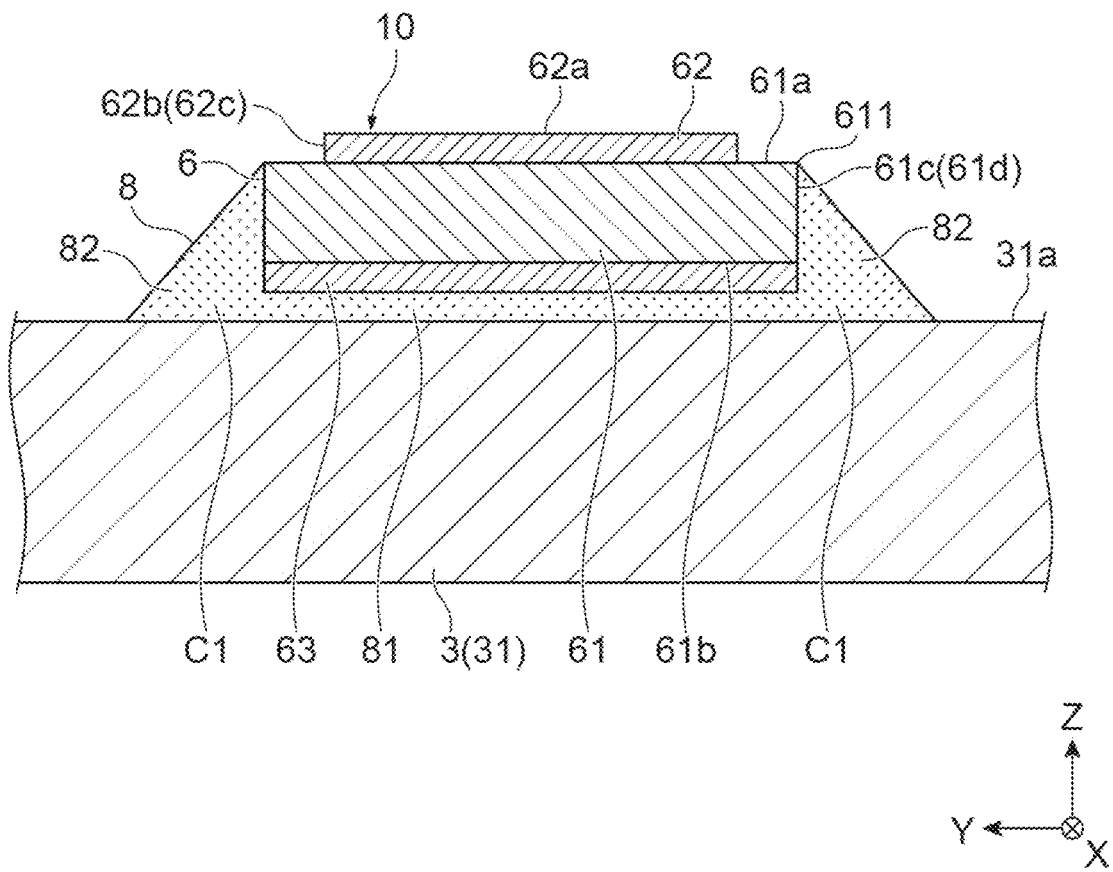
FIG. 6 is a cross-sectional view of a metal substrate, a piezoelectric drive element, and a second bonding member in a first modification example.

The present disclosure is not limited to the above-described embodiment. For example, the second portion 82 of the second bonding member 8 may be in contact with the outer edge 611 of the first main surface 61a. In the example illustrated in FIG. 6, the second portion 82 is formed such that the second portion 82 is in contact with the outer edge 611 of the first main surface 61a and the surface of the second portion 82 is flat. According to the present modification example, it is possible to more reliably secure bonding strength between the metal substrate 3 and the piezoelectric drive element 6. In addition, the second portion 82 may not reach a region on the first electrode 62 side of the side surface 61c of the piezoelectric drive body 61. In that case, the highest edge portion of the second portion 82 may be in contact with a region on a second electrode 63 side of the side surface 61c.

Figure 7:
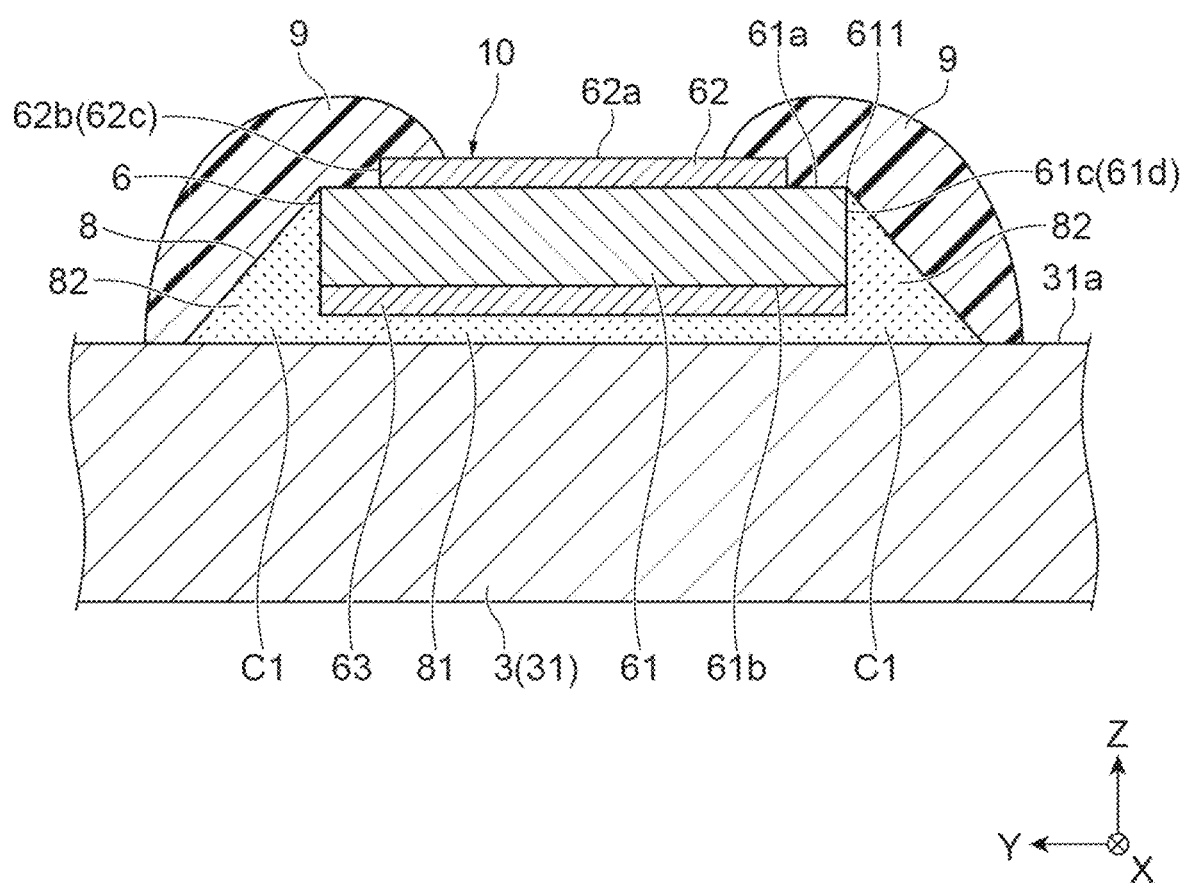
FIG. 7 is a cross-sectional view of a metal substrate, a piezoelectric drive element, and a second bonding member in a second modification example.

In addition, for example, the piezoelectric unit 10 may further include a protective member. In the example illustrated in FIG. 7, a protective member 9 covers the second portion 82 in the corner C1. "The protective member 9 covers the bonding member" means that the protective member 9 is in contact with at least a part of the second portion 82. The protective member 9 further covers a side surface 62b of the first electrode 62. "The protective member 9 covers the side surface 62b of the first electrode 62" means that the protective member 9 is in contact with at least a part of the side surface 62b of the first electrode 62. The protective member 9 is, for example, a non-conductive resin. According to the present modification example, it is possible to prevent degradation of the second bonding member 8. This effect is particularly effective when the material of the second bonding member 8 contains fillers such as Ag particles or the like that are easily degraded by sulfur-based gas or the like. Further, in the present modification example, since the protective member 9 further covers the side surface 62b of the first electrode 62, it is possible to prevent degradation of the first electrode 62. Particularly, in the first electrode 62 that is a Ni/Au layer, the thickness of the Ni layer is larger than the thickness of the Au layer. Therefore, the Ni layer is easily exposed on the side surface 62b. According to the configuration of the present modification example, since the Ni layer in the side surface 62b is covered with the protective member 9, the Ni layer being easily degraded by sulfur-based gas or the like, it is possible to prevent degradation of the first electrode 62. Incidentally, since the Au layer having relatively high stability is exposed on the surface on the opposite side of the first electrode 62 from the piezoelectric drive body 61, the protective member 9 may not be provided. In addition, the configuration of the present modification example is not limited to the above configuration. For example, the protective member 9 may cover a part of the second portion 82. In addition, for example, the protective member 9 may not cover the side surface 62b of the first electrode 62.

Figure 8:
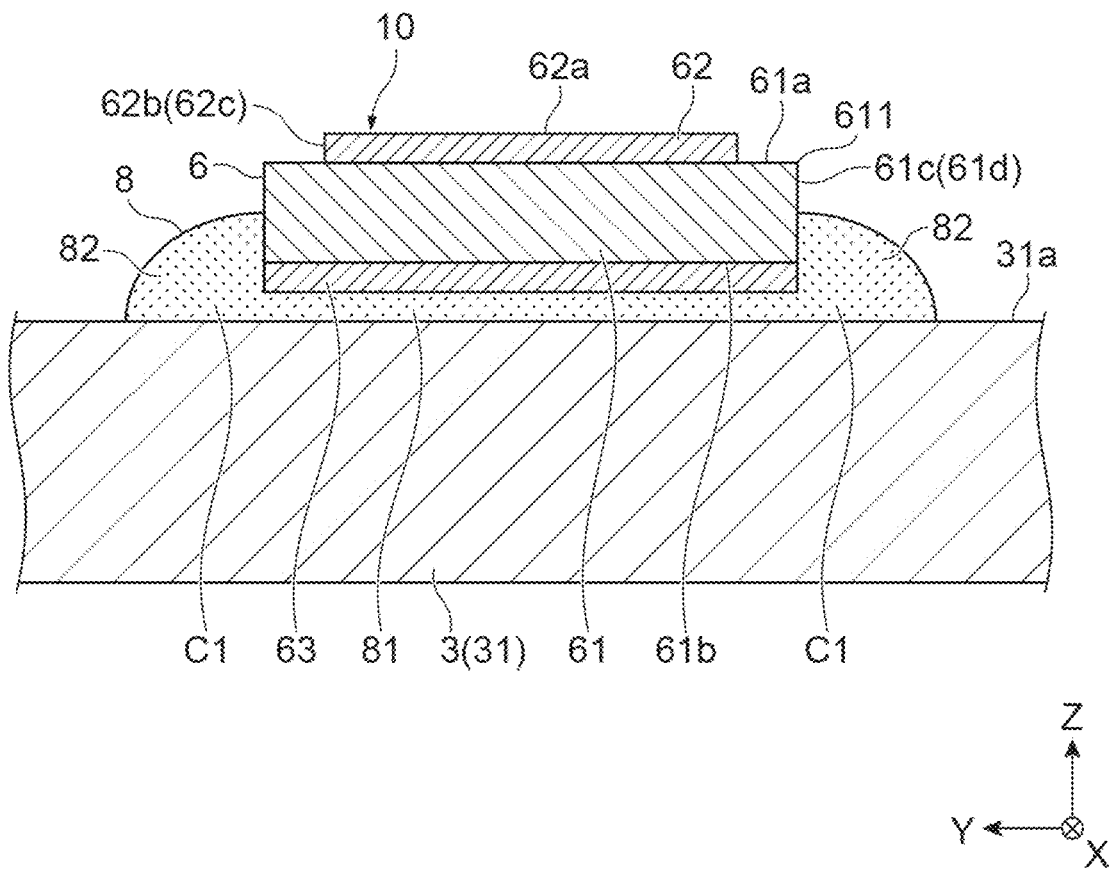
FIG. 8 is a cross-sectional view of a metal substrate, a piezoelectric drive element, and a second bonding member in a third modification example.
Figure 9:
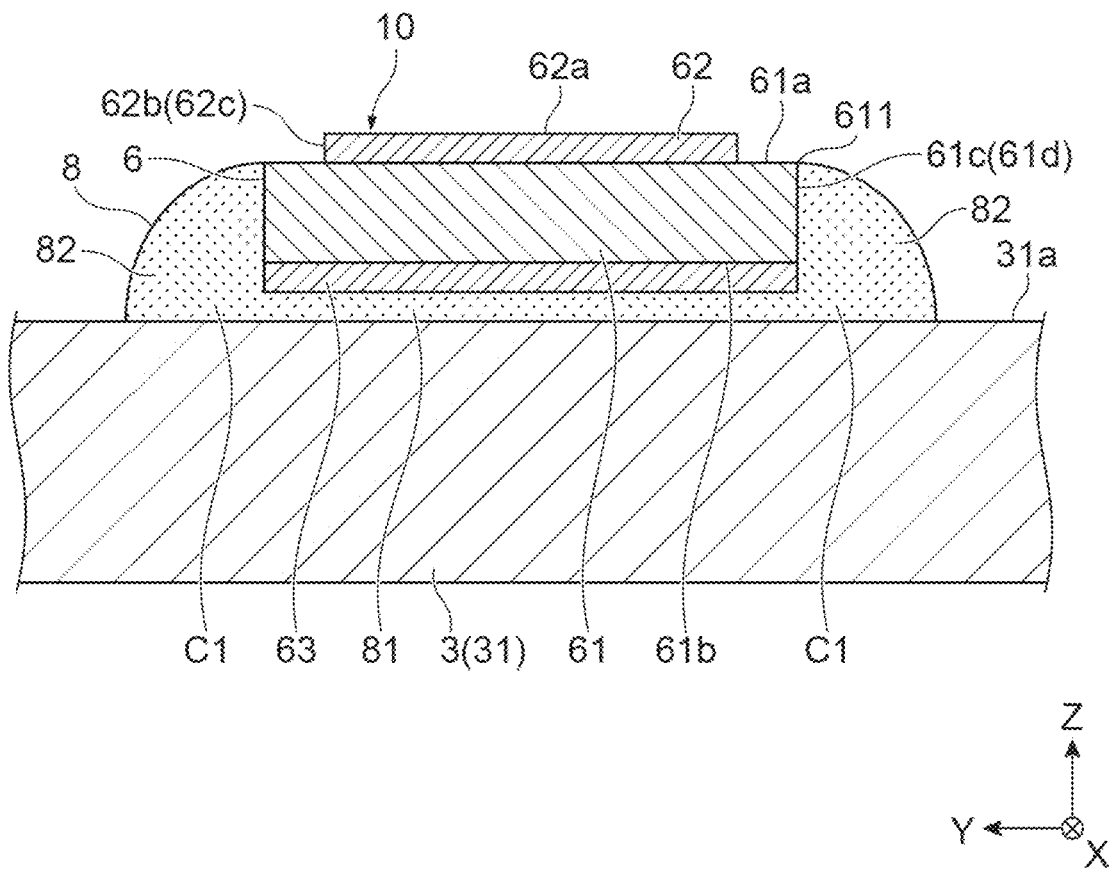
FIG. 9 is a cross-sectional view of a metal substrate, a piezoelectric drive element, and a second bonding member in a fourth modification example.
Figure 10:
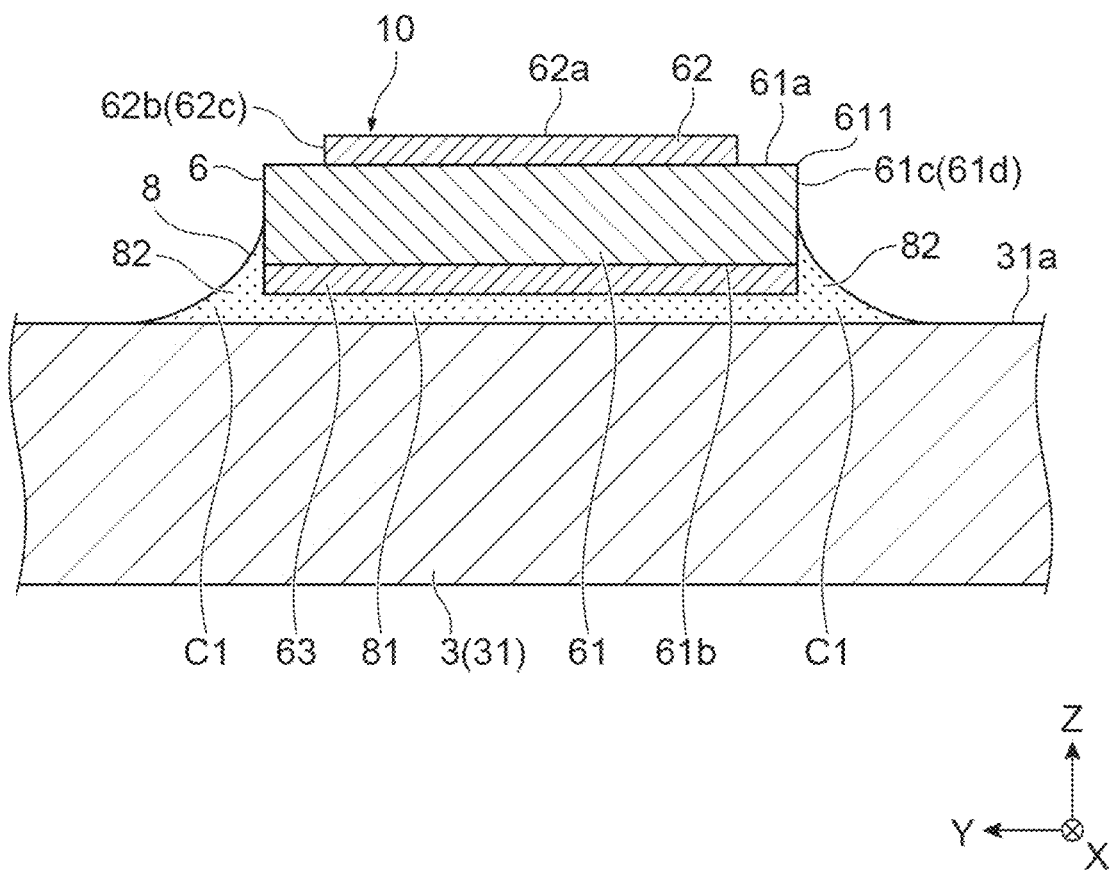
FIG. 10 is a cross-sectional view of a metal substrate, a piezoelectric drive element, and a second bonding member in a fifth modification example.
Figure 11:
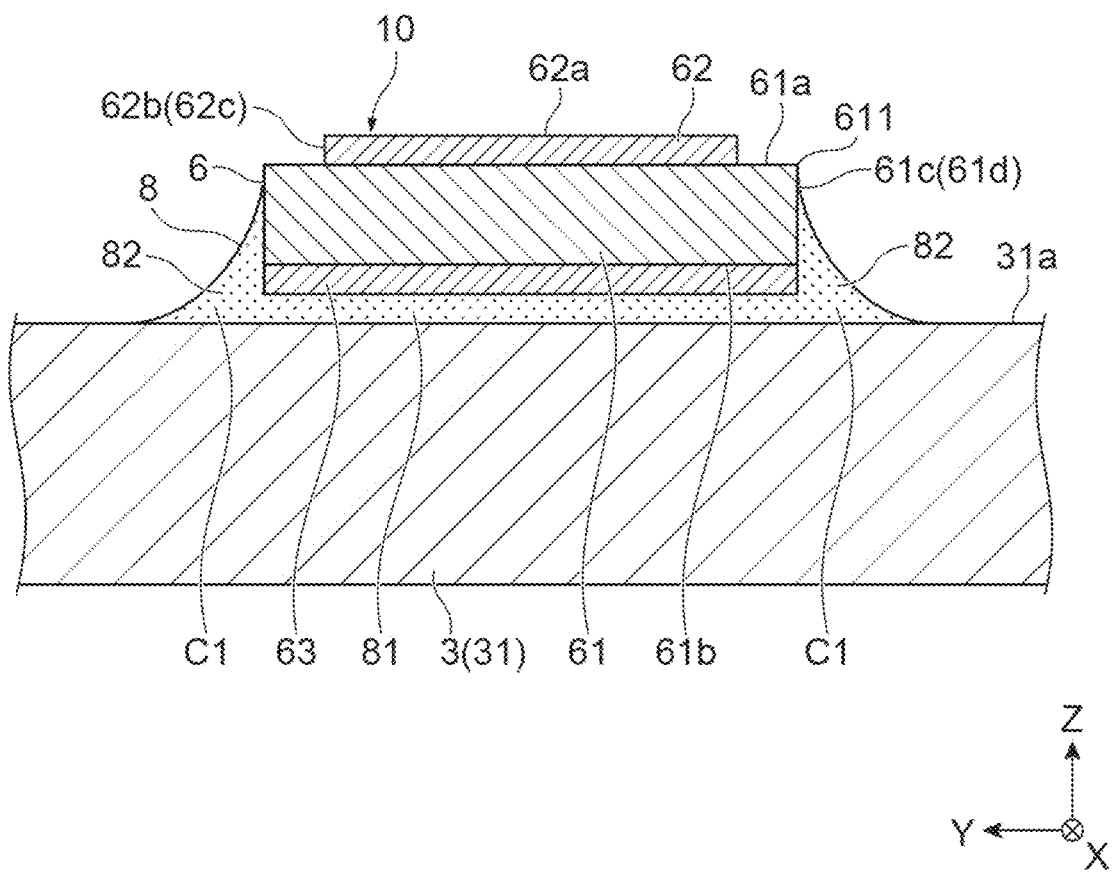
FIG. 11 is a cross-sectional view of a metal substrate, a piezoelectric drive element, and a second bonding member in a sixth modification example.

The shapes of the first portion 81 of the second bonding member 8 and the second portion 82 of the second bonding member 8 are not particularly limited. For example, the first portion 81 may not be formed over an entire region between the placement surface 31a and the piezoelectric drive element 6, and at least a part of the first portion 81 may be continuous with the second portion 82. For example, the second portion 82 may be formed such that the surface of the second portion 82 is bulged as in the examples illustrated in FIGS. 8 and 9. In the example illustrated in FIG. 8, the second portion 82 does not reach the outer edge 611 of the first main surface 61a. In the example illustrated in FIG. 9, the second portion 82 reaches the outer edge 611 of the first main surface 61a. According to the examples illustrated in FIGS. 8 and 9, since the amount of the second bonding member 8 is increased, it is possible to further secure bonding strength between the metal substrate 3 and the piezoelectric drive element 6. In addition, for example, the second portion 82 may be formed such that the surface of the second portion 82 is recessed as in the examples illustrated in FIGS. 10 and 11. In the example illustrated in FIG. 10, the second portion 82 does not reach the outer edge 611 of the first main surface 61a. In the example illustrated in FIG. 11, the second portion 82 reaches the outer edge 611 of the first main surface 61a. According to the examples illustrated in FIGS. 10 and 11, since the amount of the second bonding member 8 is reduced, the influence of the mass of the second bonding member 8 on the total mass of the metal substrate 3 is reduced. Therefore, when the piezoelectric unit 10 is applied to the actuator device 1, it is possible to minimize the influence of the amount of the second bonding member 8 on the driving characteristic, and it is possible to realize stable driving of the actuator device 1.

Figure 12:
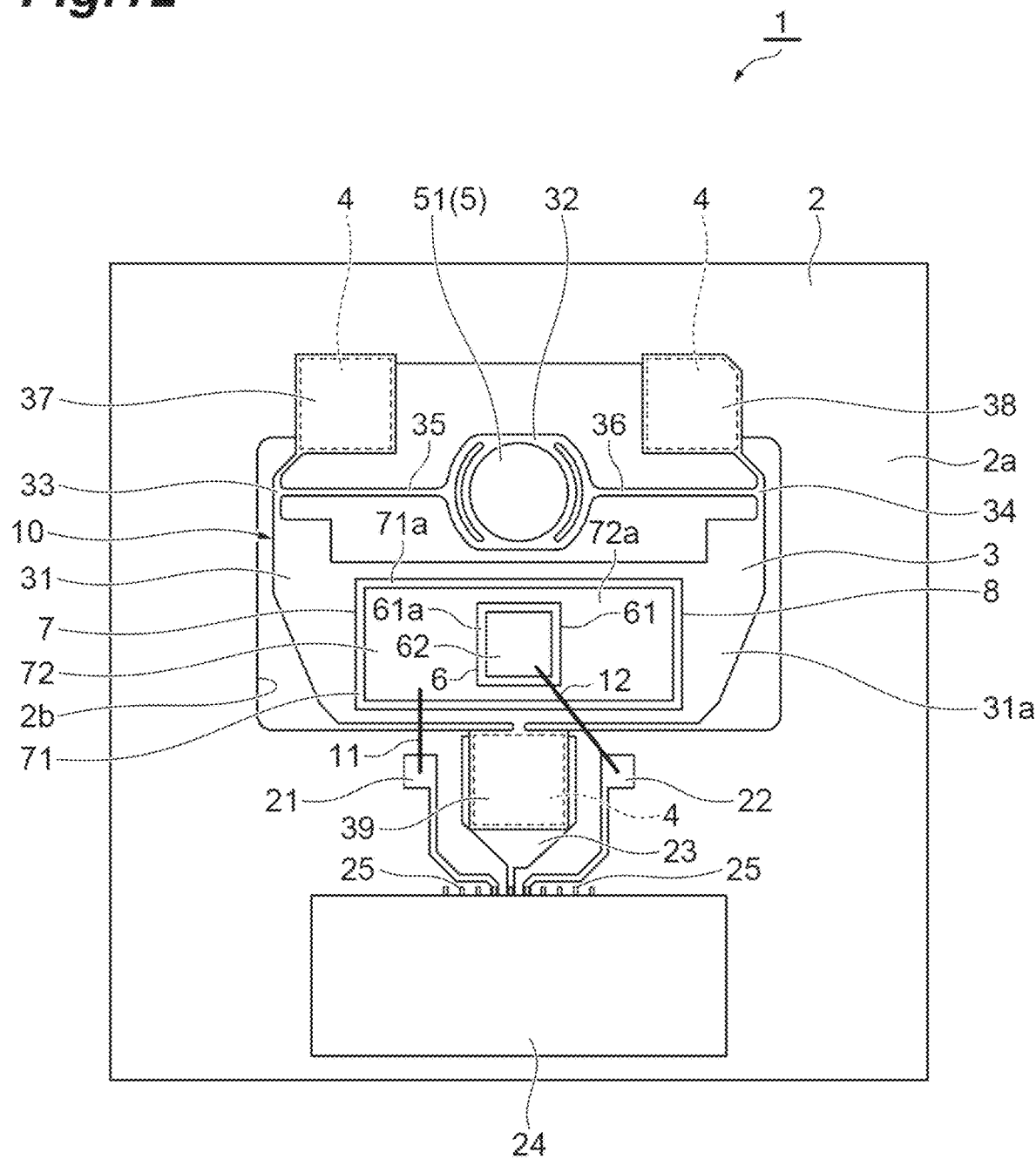
FIG. 12 is a plan view of an actuator device of a seventh modification example.
Figure 13:
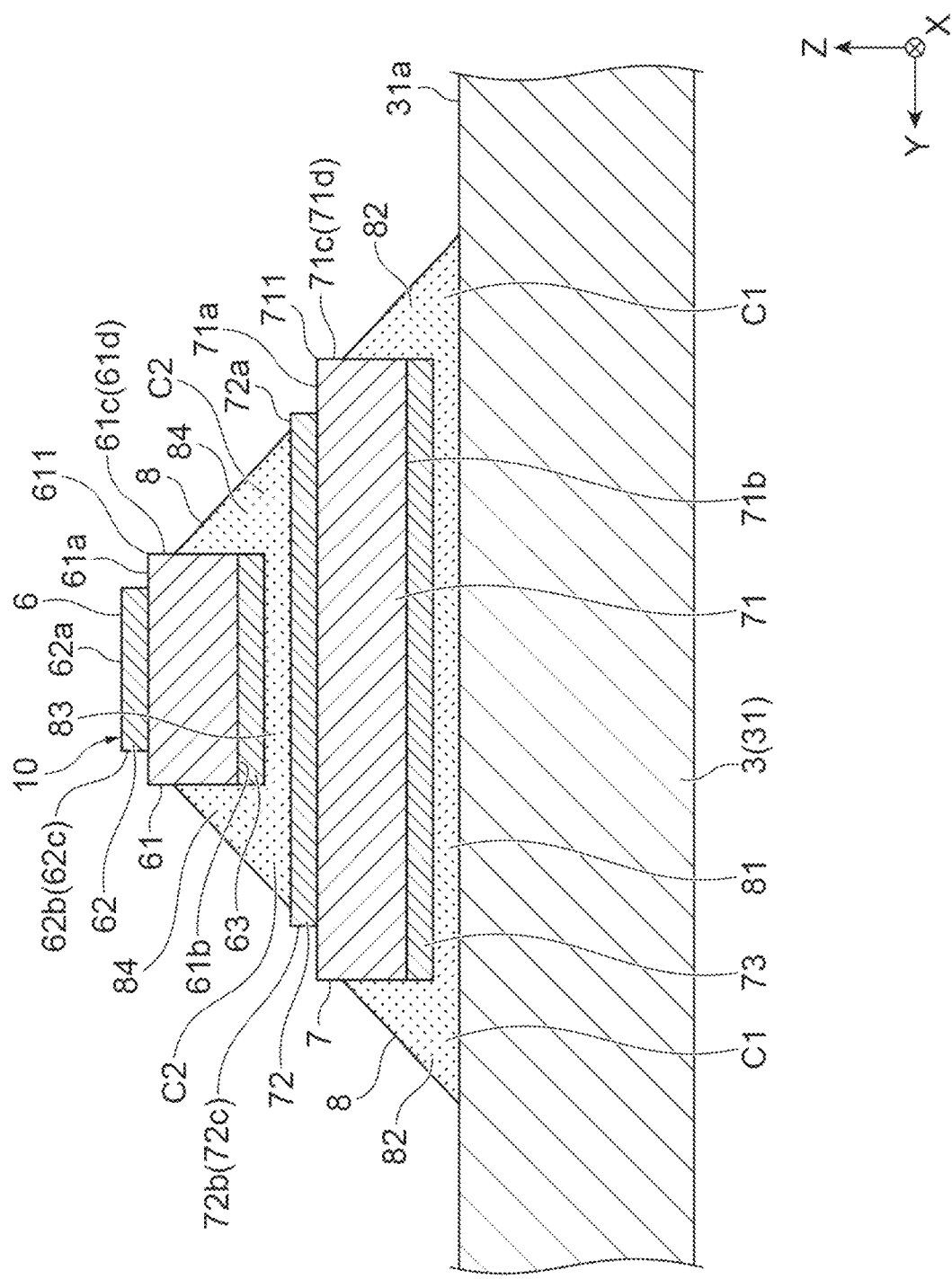
FIG. 13 is a cross-sectional view of a metal substrate, a piezoelectric detection element, and a piezoelectric drive element illustrated in FIG. 12.

In addition, when viewed in the Z-axis direction, the second portion 82 may be intermittently formed in the corner C1 instead of being continuous over the entirety of the corner C1. Accordingly, while the amount of the second bonding member 8 is reduced to minimize its influence on the driving characteristic, the second bonding member 8 is formed at a plurality of locations along the corner C1, so that it is possible to reliably secure bonding strength between the metal substrate 3 and the piezoelectric drive element 6. Incidentally, it is preferable that when viewed in the Z-axis direction, the second portion 82 is formed on at least a side portion of the corner C1 formed along the outer edge 61d of the piezoelectric drive element 6, the side portion being aligned along the X-axis direction which is a longitudinal direction (namely, a side portion corresponding to a long side of the piezoelectric drive element 6). Accordingly, since the second portion 82 is formed so as to correspond to the long side of the piezoelectric drive element 6, it is possible to improve bonding strength between the metal substrate 3 and the piezoelectric drive element 6, and cause a strain generated by the piezoelectric drive element 6, to efficiently propagate to the metal substrate 3, and when the second bonding member 8 bonds the metal substrate 3 and the piezoelectric detection element 7 (refer to FIGS. 12 and 13 to be described later), it is possible to accurately detect an oscillation angle of the optical surface 51 of the optical function unit 5. In addition, when viewed in the Z-axis direction, the second portion 82 may be formed on each of side portions (namely, side portions corresponding to each long side and each short side of the piezoelectric drive element 6) of the corner C1 formed along the outer edge 61d of the piezoelectric drive element 6.

In addition, the height of the second portion 82 formed continuously over the entirety of the corner C1 or intermittently in the corner C1 may vary depending on place. Namely, the height of the second portion 82 may be non-uniform. In addition, the shape (a bulged shape, a recessed shape, or the like) of the surface of the second portion 82 formed continuously over the entirety of the corner C1 or intermittently in the corner C1 may vary depending on place. Namely, the shape of the surface of the second portion 82 may be non-uniform. Namely, the height of the second portion 82 and the shape of the surface of the second portion 82 (refer to FIGS. 8 to 11) may vary depending on the place where the second portion 82 is formed in the corner C1. Accordingly, the higher the height of the location is and the more the surface of the location is bulged on the second portion 82 formed in the corner C1, it is possible to even further secure bonding strength between the metal substrate 3 and the piezoelectric drive element 6. Further, the lower the height of the location is and the more the surface of the location is recessed on the second portion 82 formed in the corner C1, it is possible to realize more stable driving of the actuator device 1. In addition, at a location where the height is high and the surface is recessed and at a location where the height is low and the surface is bulged on the second portion 82 formed in the corner C1, it is possible to realize the securing of bonding strength between the metal substrate 3 and the piezoelectric drive element 6 and stable driving of the actuator device 1 in a well-balanced manner. In addition, since a location where the height is high, a location where the surface is bulged, and/or a location where the height is high and the surface is bulged on the second portion 82 can be discontinuously formed along the outer edge 61d of the piezoelectric drive element 6 by making at least one of the height of and the shape of the surface of the second portion 82 non-uniform, it is possible to reliably secure bonding strength between the metal substrate 3 and the piezoelectric drive element 6.

In addition, the second portion 82 formed continuously over the entirety of the corner C1 or intermittently in the corner C1 may be stereoscopically (three-dimensionally) bulged or recessed along the corner C1 (namely, along the X-axis direction and along the Y-axis direction). In addition, a location that is stereoscopically bulged and a location that is stereoscopically recessed may be alternately formed in the second portion 82. Accordingly, since a plurality of stereoscopic bulges are continuously formed on the surface of the second bonding member 8, it is possible to reliably secure bonding strength between the metal substrate 3 and the piezoelectric drive element 6, and it is possible to realize stable driving of the actuator device 1.

The distance between the outer edge 62c of the first electrode 62 and the outer edge 61d of the piezoelectric drive body 61 when viewed in the Z-axis direction may be equal to or less than the thickness of the piezoelectric drive body 61. As one example, the thickness of the piezoelectric drive body 61 is approximately 200 μm, and the distance between the outer edge 62c and the outer edge 61d when viewed in the Z-axis direction is approximately 100 μm. Accordingly, it is possible to realize the securing of the distance between the outer edge 611 of the first main surface 61a and the first electrode 62 and the securing of the size of the first electrode 62 in a well-balanced manner, and as a result, it is possible to realize both the prevention of a short circuit in the piezoelectric drive element 6 and an improvement in the driving efficiency of the piezoelectric drive body 61. In addition, when viewed in the Z-axis direction, the outer edge 62c of the first electrode 62 may be located to overlap the outer edge 61d of the piezoelectric drive body 61.

The piezoelectric drive element 6 may not include the second electrode 63. In that case, the piezoelectric drive body 61 and the main body portion 31 of the metal substrate 3 may be bonded by the second bonding member 8.

The wiring substrate 2 is not limited to the shape of the above embodiment and may include, for example, a recessed portion in which a central portion is recessed opposite the metal substrate 3 with respect to the placement surface 2a, instead of an opening. In addition, for example, the wiring substrate 2 may include a plurality of column portions instead of an opening. In addition, in the above embodiment, the wiring substrate 2 that supports the metal substrate 3 has been provided as an example, but the metal substrate 3 may be supported by, for example, a support body including a plurality of members.

The piezoelectric drive element 6 and the piezoelectric detection element 7 may have an opposite positional relationship and configuration. In the examples illustrated in FIGS. 12 and 13, the piezoelectric detection element (piezoelectric element) 7 is fixed to the placement surface 31a of the main body portion 31, and the piezoelectric drive element (another piezoelectric element) 6 is fixed onto the piezoelectric detection element 7. The piezoelectric detection element 7 includes the piezoelectric detection body (piezoelectric body) 71, the third electrode (first electrode) 72, and the fourth electrode (second electrode) 73. The piezoelectric detection body 71 includes the third main surface (first main surface) 71a, the fourth main surface (second main surface) 71b, and the side surface 71c. The piezoelectric drive element 6 includes the piezoelectric drive body (another piezoelectric body) 61, the first electrode (third electrode) 62, and the second electrode 63. The piezoelectric drive body 61 includes the first main surface (third main surface) 61a, the second main surface (fourth main surface) 61b, and the side surface (another side surface) 61c.

The piezoelectric detection element 7 is disposed on the placement surface 31a such that a part of the placement surface 31a is located outside the side surface 71c of the piezoelectric detection body 71. Accordingly, the corner C1 is formed by the part of the placement surface 31a and the side surface 71c of the piezoelectric detection body 71. The part of the placement surface 31a is a portion of the placement surface 31a outside the side surface 71c. The first portion 81 of the second bonding member 8 is disposed between the placement surface 31a and the piezoelectric detection element 7, and the second portion 82 is continuous from the first portion 81 and is disposed in the corner C1. The second portion 82 is in contact with the side surface 71c of the piezoelectric detection body 71 and with the part of the placement surface 31a. At least a part of the second portion 82 reaches a region on the third electrode 72 side of the side surface 71c of the piezoelectric detection body 71. In addition, the second portion 82 does not reach the outer edge 711 of the third main surface 71a.

The piezoelectric drive element 6 is disposed on a surface 72a such that a part of the surface 72a of the third electrode 72 is located outside the side surface 61c of the piezoelectric drive body 61. The surface 72a is a main surface on an opposite side of the third electrode 72 from the piezoelectric detection body 71. Accordingly, the corner (another corner) C2 is formed by the part of the surface 72a of the third electrode 72 and the side surface 61c of the piezoelectric drive body 61. The part of the surface 72a is a portion of the surface 72a outside the side surface 61c. The third portion 83 of the second bonding member 8 is a portion disposed between the surface 72a of the third electrode 72 and the piezoelectric drive element 6, and the fourth portion 84 is continuous from the third portion 83 and is disposed in the corner C2. The fourth portion 84 is in contact with the side surface 61c of the piezoelectric drive body 61 and with the part of the surface 72a of the third electrode 72. At least a part of the fourth portion 84 reaches a region on the first electrode 62 side of the side surface 61c of the piezoelectric drive body 61. In addition, the fourth portion 84 does not reach the outer edge 611 of the first main surface 61a.

In the present modification example, the second bonding member 8 includes the first portion 81 disposed between the placement surface 31a of the metal substrate 3 and the piezoelectric detection element 7, and the second portion 82 disposed in the corner C1 formed by the part of the placement surface 31a and the side surface 71c of the piezoelectric detection body 71, and the second portion 82 is continuous from the first portion 81. Accordingly, it is possible to accurately detect an oscillation angle of the optical surface 51 of the optical function unit 5, and it is possible to ensure electrical connection between the metal substrate 3 and the piezoelectric detection element 7. Further, since the second portion 82 of the second bonding member 8 does not reach the third electrode 72, it is possible to prevent a short circuit in the piezoelectric detection element 7. Therefore, according to the present modification example, while preventing a short circuit in the piezoelectric detection element 7, it is possible to ensure electrical connection between the metal substrate 3 and the piezoelectric detection element 7, and it is possible to obtain a desired driving characteristic.

In the above embodiment, the optical function unit 5 has the optical surface 51 that is a mirror surface, but the optical function unit 5 may be, for example, a reflection type diffraction grating, a transmission type diffraction grating, an optical filter, or the like. In addition, the actuator device 1 may include the piezoelectric unit 10 and the wiring substrate 2, and for example, the connector 24, the wire 11, and the wire 12 may not be attached to the actuator device 1. In addition, the piezoelectric unit 10 may include the metal substrate 3, a piezoelectric element, and the second bonding member 8. The piezoelectric element may be the piezoelectric drive element 6, and in that case, the piezoelectric unit 10 may not include the piezoelectric detection element 7. In addition, the piezoelectric element may be the piezoelectric detection element 7, and in that case, the piezoelectric unit 10 may not include the piezoelectric drive element 6. In addition, the piezoelectric unit 10 may include another piezoelectric drive being different from the piezoelectric drive element 6 on the first electrode 62 of the piezoelectric drive element 6, instead of the piezoelectric detection element 7. In addition, the metal substrate 3 includes the movable portion 32, the main body portion 31, and a coupling portion that couples the movable portion 32 and the main body portion 31. For example, the metal substrate 3 may not include the first connection portion 37, the second connection portion 38, and the third connection portion 39, a portion of the main body portion 31 of the metal substrate 3 may face a portion of the wiring substrate 2, and the portion of the main body portion 31 and the portion of the wiring substrate 2 may be bonded by the first bonding member 4.

A piezoelectric unit according to one aspect of the present disclosure includes: a metal substrate; a piezoelectric element disposed on a placement surface of the metal substrate; and a bonding member having conductivity and bonding the metal substrate and the piezoelectric element. The piezoelectric element includes a piezoelectric body having a first main surface opposite the placement surface, a second main surface on a placement surface side, and a side surface, and a first electrode disposed on the first main surface. The piezoelectric element is disposed on the placement surface such that a part of the placement surface is located outside the side surface. The bonding member includes a first portion disposed between the placement surface and the piezoelectric element, and a second portion being continuous from the first portion and disposed in a corner formed by the part of the placement surface and the side surface of the piezoelectric body. The second portion does not reach the first electrode.

In the piezoelectric unit, the bonding member includes the first portion disposed between the placement surface and the piezoelectric element, and the second portion disposed in the corner formed by the part of the placement surface and the side surface of the piezoelectric body, and the second portion is continuous from the first portion. Accordingly, when the piezoelectric element is a piezoelectric drive element that generates vibration in the metal substrate, the vibration of the piezoelectric body appropriately propagates to the metal substrate. In addition, when the piezoelectric element is a piezoelectric detection element that detects an oscillation angle of an optical function unit included in the metal substrate, the oscillation angle of the optical function unit is accurately detected. Therefore, it is possible to obtain a desired driving characteristic, and it is possible to ensure electrical connection between the metal substrate and the piezoelectric element. Further, since the second portion of the bonding member does not reach the first electrode, it is possible to prevent a short circuit in the piezoelectric element. Therefore, according to the piezoelectric unit, while preventing a short circuit in the piezoelectric element, it is possible to ensure electrical connection between the metal substrate and the piezoelectric element, and it is possible to obtain a desired driving characteristic.

In the piezoelectric unit of the present disclosure, when viewed in a thickness direction of the metal substrate, an outer edge of the first electrode may be located inside an outer edge of the piezoelectric body. Accordingly, since it is possible to realize a configuration where the bonding member does not reach the first electrode even though the bonding member has reached an outer edge of the first main surface, it is possible to prevent a short circuit in the piezoelectric element.

In the piezoelectric unit of the present disclosure, a distance between the outer edge of the first electrode and the outer edge of the piezoelectric body when viewed in the thickness direction of the metal substrate may be larger than a thickness of the piezoelectric body. Accordingly, since it is possible to secure a distance between the outer edge of the first main surface and the first electrode, it is possible to reliably realize a configuration where the bonding member does not reach the first electrode, and as a result, it is possible to even further prevent a short circuit in the piezoelectric element.

In the piezoelectric unit of the present disclosure, a distance between the outer edge of the first electrode and the outer edge of the piezoelectric body when viewed in the thickness direction of the metal substrate may be equal to or less than a thickness of the piezoelectric body. Accordingly, it is possible to realize the securing of the distance between the outer edge of the first main surface and the first electrode and the securing of the size of the first electrode in a well-balanced manner, and as a result, it is possible to realize both the prevention of a short circuit in the piezoelectric element and the securing of a desired driving efficiency.

In the piezoelectric unit of the present disclosure, at least a part of the second portion may reach a region on a first electrode side of the side surface of the piezoelectric body. Accordingly, it is possible to improve bonding strength between the metal substrate and the piezoelectric element.

In the piezoelectric unit of the present disclosure, the second portion may not reach an outer edge of the first main surface. Accordingly, while improving bonding strength between the metal substrate and the piezoelectric element, it is possible to reliably realize a configuration where the bonding member does not reach the first electrode.

In the piezoelectric unit of the present disclosure, the piezoelectric element may further include a second electrode disposed on the second main surface. Accordingly, since the wettability of the bonding member is improved, it is possible to even further ensure electrical connection between the metal substrate and the piezoelectric element. In addition, even when a crack occurs in the first portion between the metal substrate and the second electrode, since it is possible to maintain the energization of the entirety of the second electrode, it is possible to prevent a disturbance in an electric field distribution of the piezoelectric element.

The piezoelectric unit of the present disclosure may further include a protective member covering the second portion in the corner. Accordingly, it is possible to prevent degradation of the bonding member.

In the piezoelectric unit of the present disclosure, the protective member may further cover a side surface of the first electrode. Accordingly, it is possible to further prevent degradation of the first electrode.

The piezoelectric unit of the present disclosure may further include another piezoelectric element being different from the piezoelectric element. The bonding member may bond the piezoelectric element and the another piezoelectric element. The another piezoelectric element may be disposed on a surface of the first electrode, and include another piezoelectric body and a third electrode, wherein the another piezoelectric body is different from the piezoelectric body and has a third main surface opposite the surface, a fourth main surface on a surface side, and another side surface being different from the side surface of the piezoelectric body, and the third electrode is disposed on the third main surface. The another piezoelectric element may be disposed on the surface such that a part of the surface is located outside the another side surface. The bonding member may further include a third portion disposed between the surface and the another piezoelectric element, and a fourth portion being continuous from the third portion and disposed in another corner being different from the corner, the another corner formed by the part of the surface and the another side surface. The fourth portion may not reach the third electrode. Accordingly, when the piezoelectric element and the another piezoelectric element are stacked on top of each other, it is possible to secure bonding strength between the piezoelectric element and the another piezoelectric element.

An actuator device of the present disclosure includes the piezoelectric unit and a support body that supports a metal substrate. The metal substrate includes a movable portion, a main body portion on which the piezoelectric element is disposed, and a coupling portion coupling the movable portion and the main body portion.

Since the actuator device includes the piezoelectric unit, for the same reason as in the piezoelectric unit, while preventing a short circuit in the piezoelectric element, it is possible to ensure electrical connection between the metal substrate and the piezoelectric element, and it is possible to obtain a desired driving characteristic.

According to one aspect of the present disclosure, it is possible to provide the piezoelectric unit and the actuator device in which electrical connection between the metal substrate and the piezoelectric element can be ensured and a desired driving characteristic can be obtained while a short circuit in the piezoelectric element is prevented.

What is claimed is:

1. A piezoelectric unit comprising:
   a metal substrate;
   a piezoelectric element disposed on a placement surface of the metal substrate; and
   a bonding member having conductivity and bonding the metal substrate and the piezoelectric element,
   wherein the piezoelectric element includes a piezoelectric body having a first main surface opposite the placement surface, a second main surface on the placement surface side, and a side surface, a first electrode disposed on the first main surface, and a second electrode disposed on the second main surface,
   the piezoelectric element is disposed on the placement surface such that a part of the placement surface is located outside the side surface,
   the bonding member includes a first portion disposed between the placement surface and the piezoelectric element, and a second portion being continuous from the first portion and disposed in a corner formed by the part of the placement surface and the side surface,
   the second portion does not reach the first electrode, and
   when viewed in a thickness direction of the metal substrate, an outer edge of the first electrode is located inside an outer edge of the piezoelectric body and is located inside an outer edge of the second electrode.

2. The piezoelectric unit according to claim 1,
   wherein a distance between the outer edge of the first electrode and the outer edge of the piezoelectric body when viewed in the thickness direction of the metal substrate is larger than a thickness of the piezoelectric body.

3. The piezoelectric unit according to claim 1,
   wherein a distance between the outer edge of the first electrode and the outer edge of the piezoelectric body when viewed in the thickness direction of the metal substrate is equal to or less than a thickness of the piezoelectric body.

4. The piezoelectric unit according to claim 1,
   wherein at least a part of the second portion reaches a region on a first electrode side of the side surface.

5. The piezoelectric unit according to claim 1,
   wherein the second portion does not reach an outer edge of the first main surface.

6. The piezoelectric unit according to claim 1, further comprising:
   a protective member covering the second portion in the corner.

7. The piezoelectric unit according to claim 6,
   wherein the protective member further covers a side surface of the first electrode.

8. An actuator device comprising:
   the piezoelectric unit according to claim 1; and
   a support body that supports the metal substrate,
   wherein the metal substrate includes a movable portion, a main body portion on which the piezoelectric element is disposed, and a coupling portion coupling the movable portion and the main body portion.

9. A piezoelectric unit comprising:
a metal substrate;
a piezoelectric element disposed on a placement surface of the metal substrate;
a bonding member having conductivity and bonding the metal substrate and the piezoelectric element; and
another piezoelectric element being different from the piezoelectric element,
wherein the piezoelectric element includes a piezoelectric body having a first main surface opposite the placement surface, a second main surface on the placement surface side, and a side surface, and a first electrode disposed on the first main surface,
the piezoelectric element is disposed on the placement surface such that a part of the placement surface is located outside the side surface,
the bonding member includes a first portion disposed between the placement surface and the piezoelectric element, and a second portion being continuous from the first portion and disposed in a corner formed by the part of the placement surface and the side surface,
the second portion does not reach the first electrode,
the bonding member bonds the piezoelectric element and the another piezoelectric element,
the another piezoelectric element is disposed on a surface of the first electrode, and includes another piezoelectric body and a third electrode, wherein the another piezoelectric body is different from the piezoelectric body and has a third main surface opposite the surface, a fourth main surface on the surface side, and another side surface being different from the side surface of the piezoelectric body, and the third electrode is disposed on the third main surface,
the another piezoelectric element is disposed on the surface of the first electrode such that a part of the surface is located outside the another side surface,
the bonding member includes a third portion disposed between the surface and the another piezoelectric element, and a fourth portion being continuous from the third portion and disposed in another corner being different from the corner, the another corner formed by the part of the surface and the another side surface, and
the fourth portion does not reach the third electrode.

* * * * *